United States Patent
Flagello et al.

(10) Patent No.: US 11,099,483 B2
(45) Date of Patent: Aug. 24, 2021

(54) EUV LITHOGRAPHY SYSTEM FOR DENSE LINE PATTERNING

(71) Applicant: Nikon Corporation, Tokyo (JP)

(72) Inventors: Donis G. Flagello, Half Moon Bay, CA (US); David M. Williamson, Tucson, AZ (US); Stephen P. Renwick, Moss Beach, CA (US); Daniel Gene Smith, Tucson, AZ (US); Michael B. Binnard, Belmont, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 15/599,148

(22) Filed: May 18, 2017

(65) Prior Publication Data
US 2017/0336715 A1 Nov. 23, 2017

Related U.S. Application Data

(60) Provisional application No. 62/504,908, filed on May 11, 2017, provisional application No. 62/490,313, (Continued)

(51) Int. Cl.
G03F 7/20 (2006.01)

(52) U.S. Cl.
CPC ...... *G03F 7/70033* (2013.01); *G03F 7/70058* (2013.01); *G03F 7/70075* (2013.01); (Continued)

(58) Field of Classification Search
CPC ............ G03F 7/70033; G03F 7/70058; G03F 7/70075; G03F 7/70116; G03F 7/702; (Continued)

(56) References Cited

U.S. PATENT DOCUMENTS

| 3,884,573 A | 5/1975 | Franklin |
| 4,924,257 A | 5/1990 | Jain |

(Continued)

FOREIGN PATENT DOCUMENTS

| CN | 103309168 | 9/2013 |
| CN | 103592816 | 2/2014 |

(Continued)

OTHER PUBLICATIONS

International Search Report for International Application No. PCT/US2012/043186, dated Sep. 14, 2012, 3 pages.
(Continued)

*Primary Examiner* — Mesfin T Asfaw
(74) *Attorney, Agent, or Firm* — Klarquist Sparkman, LLP

(57) ABSTRACT

Extreme ultra-violet (EUV) lithography ruling engine specifically configured to print one-dimensional lines on a target workpiece includes source of EUV radiation; a pattern-source defining 1D pattern; an illumination unit (IU) configured to irradiate the pattern-source; and projection optics (PO) configured to optically image, with a reduction factor N>1, the 1D pattern on image surface that is optically-conjugate to the 1D pattern. Irradiation of the pattern-source can be on-axis or off-axis. While 1D pattern has first spatial frequency, its optical image has second spatial frequency that is at least twice the first spatial frequency. The pattern-source can be flat or curved. The IU may include a relay reflector. A PO's reflector may include multiple spatially-distinct reflecting elements aggregately forming such reflector. The engine is configured to not allow formation of optical image of any 2D pattern that has spatial resolution substantially equal to a pitch of the 1D pattern of the pattern-source.

29 Claims, 19 Drawing Sheets

Related U.S. Application Data filed on Apr. 26, 2017, provisional application No. 62/487,245, filed on Apr. 19, 2017, provisional application No. 62/476,476, filed on Mar. 24, 2017, provisional application No. 62/353,245, filed on Jun. 22, 2016, provisional application No. 62/352,545, filed on Jun. 20, 2016, provisional application No. 62/338,893, filed on May 19, 2016.

(52) U.S. Cl.
CPC ...... *G03F 7/70116* (2013.01); *G03F 7/70283* (2013.01); *G03F 7/70325* (2013.01)

(58) Field of Classification Search
CPC .... G03F 7/70191; G03F 7/70283; G03F 1/22; G03F 7/20; G03F 1/24; G03F 7/70091; G03F 7/7005; G03F 7/70108; G03F 7/7015; G03F 7/70625; G03F 7/2008; G03F 1/52; G03F 7/2022; G03F 7/70325; G03F 7/70258

See application file for complete search history.

(56) References Cited

U.S. PATENT DOCUMENTS

| | | | |
|---|---|---|---|
| 5,003,567 A | 3/1991 | Hawryluk | |
| 5,144,363 A | 9/1992 | Wittekoek et al. | |
| 5,212,588 A | 5/1993 | Viswanathan et al. | |
| 5,477,304 A | 12/1995 | Nishi | |
| 5,623,853 A | 4/1997 | Novak et al. | |
| 5,668,672 A | 9/1997 | Oomura | |
| 5,689,377 A | 11/1997 | Takahashi | |
| 5,835,275 A | 11/1998 | Takahashi et al. | |
| 5,854,671 A | 12/1998 | Nishi | |
| 5,874,820 A | 2/1999 | Lee | |
| 5,892,117 A | 4/1999 | Theriot | |
| 6,014,421 A * | 1/2000 | Chiba | G03F 7/70233 378/34 |
| 6,331,710 B1 * | 12/2001 | Wang | G02B 13/143 250/492.2 |
| 8,223,345 B2 | 7/2012 | Hidaka et al. | |
| 8,411,249 B2 | 4/2013 | Hidaka et al. | |
| 8,502,978 B2 | 8/2013 | Hidaka | |
| 8,599,387 B2 | 12/2013 | Hidaka | |
| 8,705,170 B2 | 4/2014 | Williamson et al. | |
| 2002/0093636 A1 * | 7/2002 | Komatsuda | G03F 7/70075 355/67 |
| 2004/0036037 A1 | 2/2004 | Rothweiler et al. | |
| 2004/0165169 A1 | 8/2004 | Antonius et al. | |
| 2008/0151211 A1 | 6/2008 | Kaiser et al. | |
| 2009/0257042 A1 * | 10/2009 | Komatsuda | G03F 7/70066 355/71 |
| 2009/0268182 A1 | 10/2009 | Staals et al. | |
| 2010/0053584 A1 | 3/2010 | Kajiyama et al. | |
| 2011/0013162 A1 | 1/2011 | Kiuchi et al. | |
| 2011/0071784 A1 | 3/2011 | Smith et al. | |
| 2012/0008150 A1 | 1/2012 | Smith et al. | |
| 2012/0274917 A1 | 11/2012 | Mann et al. | |
| 2013/0070227 A1 | 3/2013 | Mueller et al. | |
| 2013/0188084 A1 | 7/2013 | Goodwin | |
| 2013/0208253 A1 * | 8/2013 | Shim | G03F 7/70208 355/67 |
| 2013/0244139 A1 | 9/2013 | Liu et al. | |
| 2013/0308140 A1 | 11/2013 | Goodwin et al. | |
| 2013/0330662 A1 | 12/2013 | Goodwin | |
| 2014/0049761 A1 | 2/2014 | Goodwin | |
| 2014/0051015 A1 | 2/2014 | Gallagher et al. | |
| 2014/0233011 A1 | 8/2014 | Goodwin et al. | |
| 2014/0253892 A1 * | 9/2014 | Yu | G03F 7/70233 355/66 |
| 2014/0268086 A1 | 9/2014 | Lu et al. | |
| 2015/0049321 A1 * | 2/2015 | Bieling | G03F 7/702 355/71 |
| 2015/0219997 A1 | 8/2015 | Kawabe et al. | |
| 2016/0033866 A1 * | 2/2016 | Lu | G03F 7/20 430/322 |
| 2016/0313646 A1 | 10/2016 | Dinger et al. | |

FOREIGN PATENT DOCUMENTS

| | | |
|---|---|---|
| CN | 104914678 | 9/2015 |
| CN | 105319860 | 2/2016 |
| CN | 105511065 | 4/2016 |
| JP | A-2000-21763 | 1/2000 |
| JP | 2001027699 A | 1/2001 |
| JP | A-2008-288299 | 11/2008 |
| WO | WO 2009/83229 A1 | 7/2009 |
| WO | 2012177663 A3 | 12/2012 |

OTHER PUBLICATIONS

Non Final Office Action dated Jun. 20, 2018 for U.S. Appl. No. 15/629,353, filed Jun. 21, 2017.
International Search Report and Written Opinion issued in related International Application No. PCT/US2018/027785, dated Jan. 4, 2019, 32 pages.
European Search Opinion dated Feb. 4, 2020 in related EP Application No. 17798827.6.
Supplemental Search Report dated Feb. 4, 2020 in related EP Application No. 17798827.6.
First Office Action from Chinese Application No. 201780044174.X, dated Jul. 28, 2020, 29 pages (with English translation).
First Office Action mailed in corresponding Japanese Patent Application No. 2018-560913, dated Jan. 19, 2021, 7 pages (with English translation, 6 pages).
Second Office Action mailed in corresponding Chinese Patent Application No. 201780044174.X, dated Feb. 23, 2021, 12 pages.

* cited by examiner

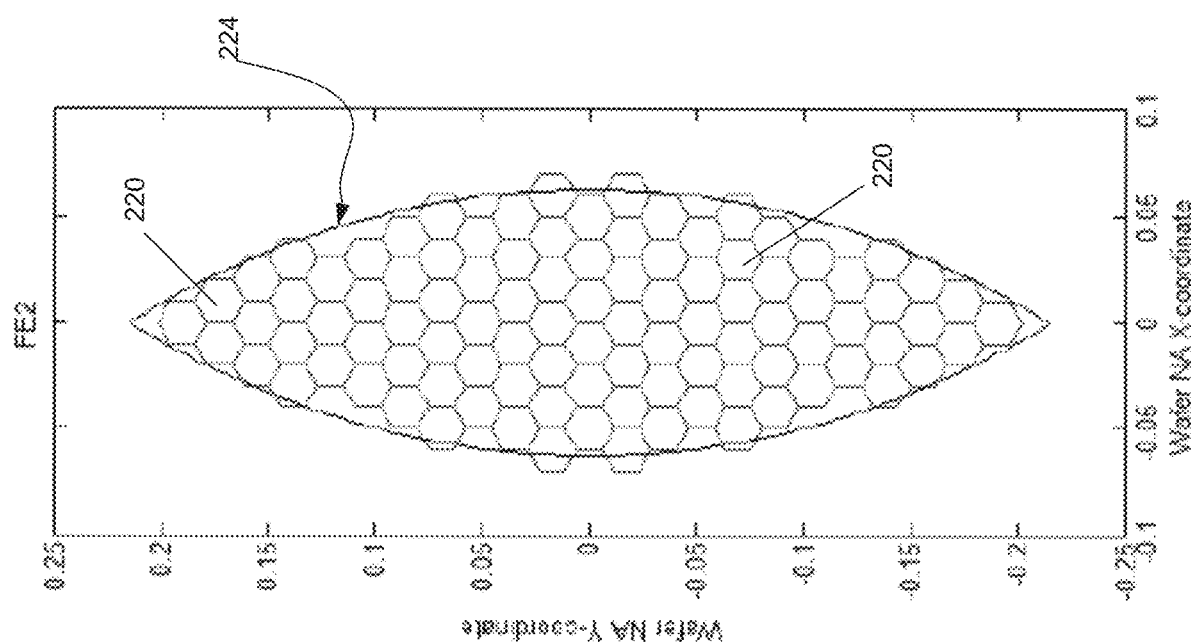
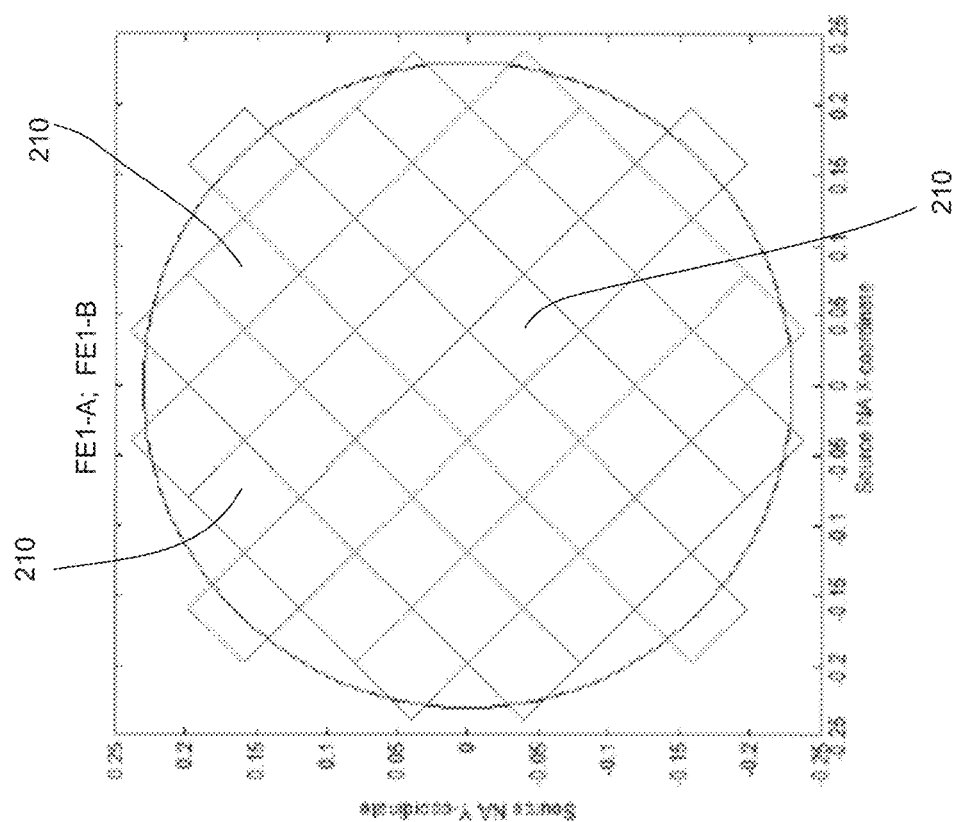
Fig. 2C
FIG. 2B

Values of fringe Zernike coefficients, in milliwaves,
for the PO design shown.

| Coefficient | Field center |
|---|---|
| Z2 | 0 |
| Z3 | 0 |
| Z4 | 0.0092 |
| Z5 | 0 |
| Z6 | 0 |
| Z7 | 0 |
| Z8 | 0 |
| Z9 | -0.1458 |
| Z10 | 0 |
| Z11 | 0 |
| Z12 | 0 |
| Z13 | 0 |
| Z14 | 0 |
| Z15 | 0 |
| Z16 | 0.0042 |
| Z17 | 0 |
| Z18 | 0 |
| Z19 | 0 |
| Z20 | 0 |
| Z21 | 0 |
| Z22 | -0.0001 |
| Z23 | 0 |
| Z24 | 0 |
| Z25 | -0.0025 |
| Z26 | 0 |
| Z27 | 0 |
| Z28 | 0 |
| Z29 | 0 |
| Z30 | 0 |
| Z31 | 0 |
| Z32 | 0 |
| Z33 | 0 |
| Z34 | 0 |
| Z35 | 0 |
| Z36 | 0.0045 |
| Z49 | 0.0059 |

FIG. 3B

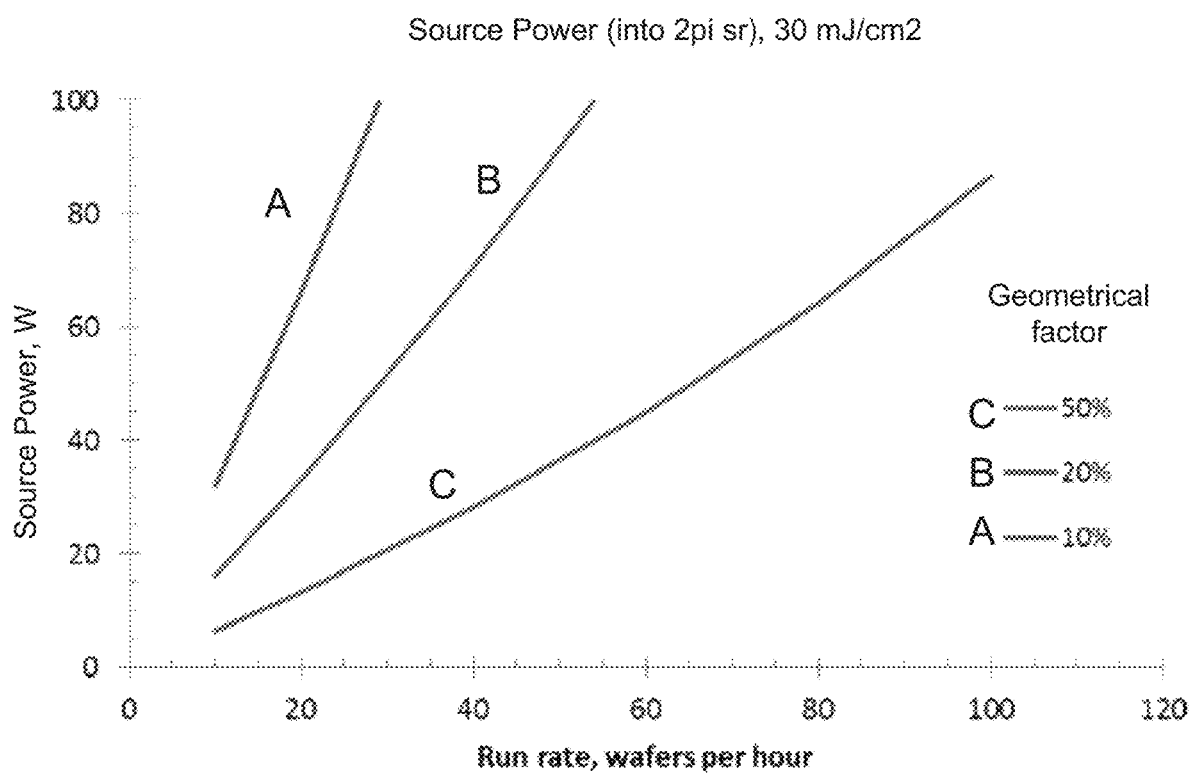

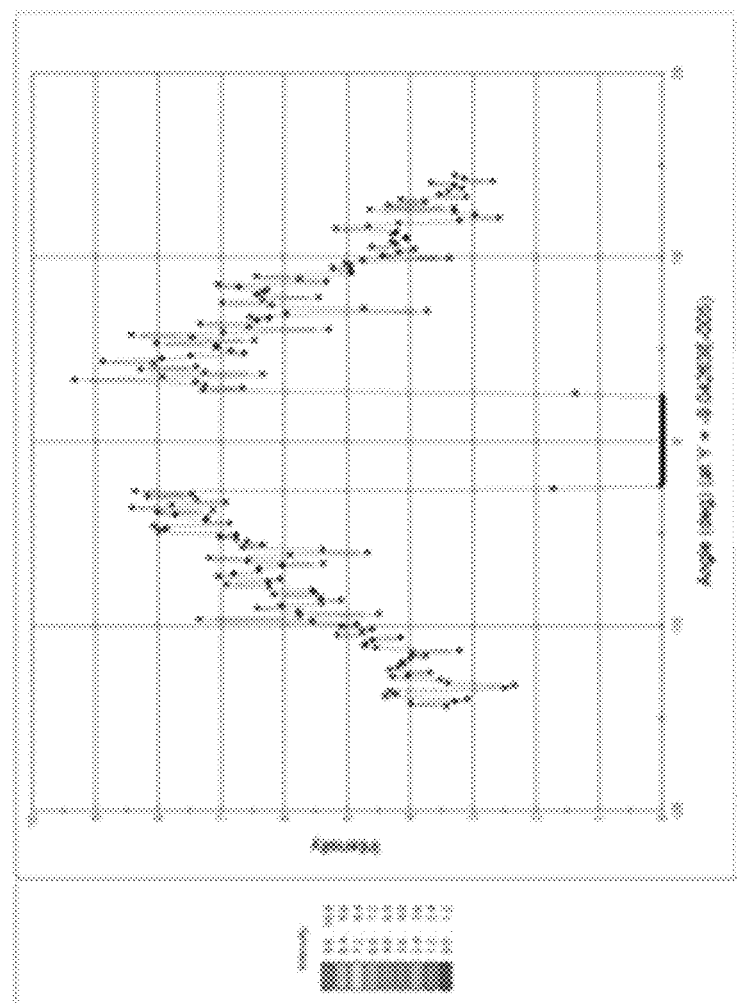
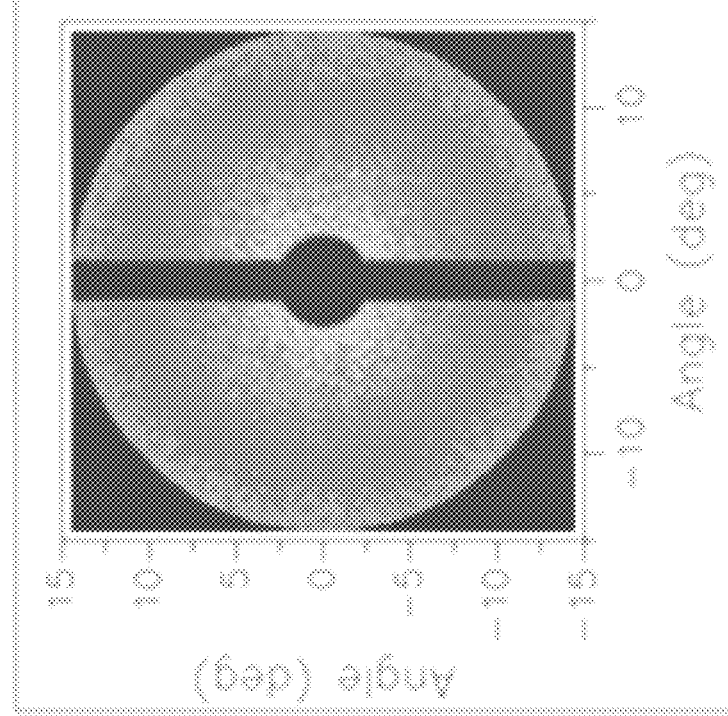
FIG. 10A
FIG. 10B

EUV LITHOGRAPHY SYSTEM FOR DENSE LINE PATTERNING

CROSS-REFERENCE TO RELATED APPLICATIONS

This application claims priority from each and every of the following US Provisional patent application Ser. No. 62/338,893 filed on May 19, 2016 and titled "EUV Lithography System for Dense Line Patterning"; Ser. No. 62/352,545 filed on Jun. 20, 2016 and titled "Dense Line Extreme Ultraviolet Lithography System with Distortion Matching"; Ser. No. 62/353,245 filed on Jun. 22, 2016 and titled "Extreme Ultraviolet Lithography System that Utilizes Pattern Stitching"; Ser. No. 62/476,476 filed on Mar. 24, 2017 and titled "Temperature Controlled Heat Transfer Frame for Pellicle"; Ser. No. 62/487,245 filed on Apr. 19, 2017 and titled "Optical Objective for Dense Line Patterning in EUV Spectral Region"; Ser. No. 62/490,313 filed on Apr. 26, 2017 and titled "Illumination System with Flat 1D-Patterned Mask for Use in EUV-Exposure Tool"; and Ser. No. 62/504,908 filed on May 11, 2017 and titled "Illumination System with Curved 1D-Patterned Mask for Use in EUV-Exposure Tool". The disclosure of each of the above-identified patent documents is incorporated by reference herein. Aggregately, the above-identified patent documents are referred to herein as Our Prior Applications.

TECHNICAL FIELD

The present invention relates to exposure tools used in lithographic processing of semiconductor wafers and, more particularly, to a simplified exposure tool configured to form, on a wafer, a pattern of parallel lines that are separated from one another by a few tens of nm or less.

BACKGROUND

Currently commercially-available EUV lithographic equipment (referred to hereinafter as general-purpose EUV systems) is structured to image a reticle mask carrying an arbitrary two-dimensional (2D) pattern(s) thereon onto rectangular fields on a semiconductor wafer (substrate). Owing to the 2D nature of such pattern that has to be optically transferred from the reticle and imaged onto the wafer, an EUV system of related art is necessarily implemented as a scanning system to provide for relative displacement between the substrate and the reticle (which is currently implemented with the use of one moving stage for the reticle and at least one more moving stage(s) for the substrate, without which a transfer of all features of the reticle pattern onto the substrate with sufficient accuracy and resolution is rather complicated and, in practice, not realized. Structural and operational complexity of the currently-used system inevitably and substantially increases operational cost and reduces the number of exposures of the substrate per unit of time, in part because the transmission of EUV light through an optical system is limited. Moreover, since the pattern transfer requires a process of optical imaging in 2D, the trains of optical components of the existing general-purpose EUV systems require and are characterized by a high degree of complexity. For example, such systems include six polished mirrors in the projection portion of the optical train, with mirror-surface roughness of less than 0.1 nm rms and mirror alignment tolerances of less than 1 nm or so; structurally complicated and tunable illumination portion of the optical train; and large reticles or masks with complex reflective coatings. In addition, the proper pattern transfer requires the use of complex combinations of alignment marks. All these inevitably lead to high costs of design and fabrication of the general-purpose EUV systems.

Other essential problems with ensuring the commercial competitiveness of general-purpose EUV systems, which are well recognized and require practical solutions, include: (A) Insufficient optical power from the EUV light sources, with which the general-purpose EUV systems are typically equipped. Currently, a typical output is about 40 W to 80 W. This problem is exacerbated by the fact that the optical power delivered to the reticle by the illumination sub-system of an EUV system from the EUV light-source is further reduced due to limited (to about 70% for each mirror) reflectance of the EUV mirrors. The illumination sub-system may further be interchangeably referred to as illumination unit (IU) or illumination lens (IL). (B) Sensitivity to defects and/or particles on the reticle mask. Indeed, because the general-purpose EUV system is configured to image the 2D pattern from the reticle onto the wafer with high resolution, the pattern transferred to the wafer can be easily corrupted by defects or particles on the reticle. Stated differently, each defect or particle on the reticle that is larger than a few tens of nanometers can corrupt the pattern printed on the wafer. (C) Extremely tight requirements on optical aberrations of a projection sub-system, imposed by the 2D nature and high resolution of the arbitrary patterns to be printed. The projection sub-system may further be referred to interchangeably as projection optics (PO) subsystem (also referred to as a projection lens, PL).

The currently-used alternative to the EUV lithography process (and specifically—the process that includes multiple patterning of the substrate with Deep Ultraviolet (DUV) light, preferably with a wavelength in the proximity of 193 nm and with the use of an immersion lens) can be less expensive but involves complicated wafer-processing between multiple exposures. Eventually, as the required resolution of features increases, a point will be reached where the multiple-patterning process cost is similar to general purpose EUV exposure cost.

For any of the above-described reasons, the use of such general-purpose EUV systems and/or alternative immersion systems for printing of patterns possessing simplified geometry is economically unattractive. There is a need, therefore, of configuring a simplified EUV system, the design and operational characteristics of which would satisfy not only the opto-mechanical requirements involved in imaging transfer of simplified reticle patterns onto the semiconductor substrate, but also the cost of which would be beneficial for industry.

SUMMARY

Embodiments of the present invention illustrate a dedicated 1D extreme-UV (EUV) exposure tool or ruling engine specifically configured to print an array of straight lines on a patternable surface of a substrate. Embodiments additionally provide a method for transmitting radiation through an extreme-UV (EUV) exposure tool and forming an optical image of an object (that includes an array of straight lines) on such substrate.

In particular, embodiments provide a 1D EUV ruling engine that includes an EUV source configured to emit EUV radiation; a holder structured to hold, in a substantially fixed position, a pattern-source defining a substantially 1D pattern; a workpiece stage configured to move a surface of the workpiece stage relative to the pattern-source held by the holder, an IU structured to irradiate the substantially 1D pattern with the EUV radiation from the source; and a PO sub-system between the IU and the workpiece stage, the PO sub-system configured to form an optical image of the 1D pattern in an image surface while said image surface is being repositioned by the workpiece stage. IN a specific case, the image surface is optically-conjugate with the substantially 1D pattern.

Embodiments also provide a 1D EUV ruling engine that includes an EUV source configured to emit EUV radiation; a pattern-source carrying a substantially 1D pattern; an IU configured to irradiate the substantially 1D pattern with the EUV radiation from the source; a workpiece stage; and a PO sub-system between the IU and the workpiece stage, the PO sub-system configured to form an optical image of the 1D pattern in an image surface while such image surface is being moved by the workpiece stage. Here, the PO sub-system includes first and second reflectors, at least one of which first and second reflectors contains first and second spatially-distinct reflecting elements. In one case, these spatially-distinct reflecting elements are spatially disconnected from one another.

Embodiments of the invention also provide a 1D EUV ruling engine that includes an EUV source configured to emit EUV radiation; a pattern-source carrying a substantially 1D pattern; an IU configured to irradiate the substantially 1D pattern with the EUV radiation from the source; and a PO sub-system configured to form, with a reduction factor N>1, an optical image of the 1D pattern on an image surface while such image surface is being repositioned with respect to the pattern-source, and while such image surface is optically-conjugate to the substantially 1D pattern. Here, the ruling engine is configured such that 1D pattern has a first spatial frequency, its optical image has a second spatial frequency, and the second spatial frequency is at least twice the first spatial frequency.

BRIEF DESCRIPTION OF THE DRAWINGS

The invention will be more fully understood by referring to the following Detailed Description in conjunction with the generally not-to scale Drawings, of which:

FIGS. 2B, 2C show, in front view, schematic diagrams of reflectors of the embodiment of FIG. 2A;

FIG. 3B lists Zernike parameters of the design of projection optics (PO) of FIG. 3A;

FIG. 6 shows a map representing radiant-power output required, under specified conditions, from a light source for use with an embodiment of the system of the invention;

FIGS. 10A, 10B illustrate, respectively, an angular distribution of radiation of the laser-driven plasma source model as viewed down the optical axis and an angular distributions of radiation of the same source in an identified cross-sectional plane that is transverse to the optical axis;

Figure 1A:
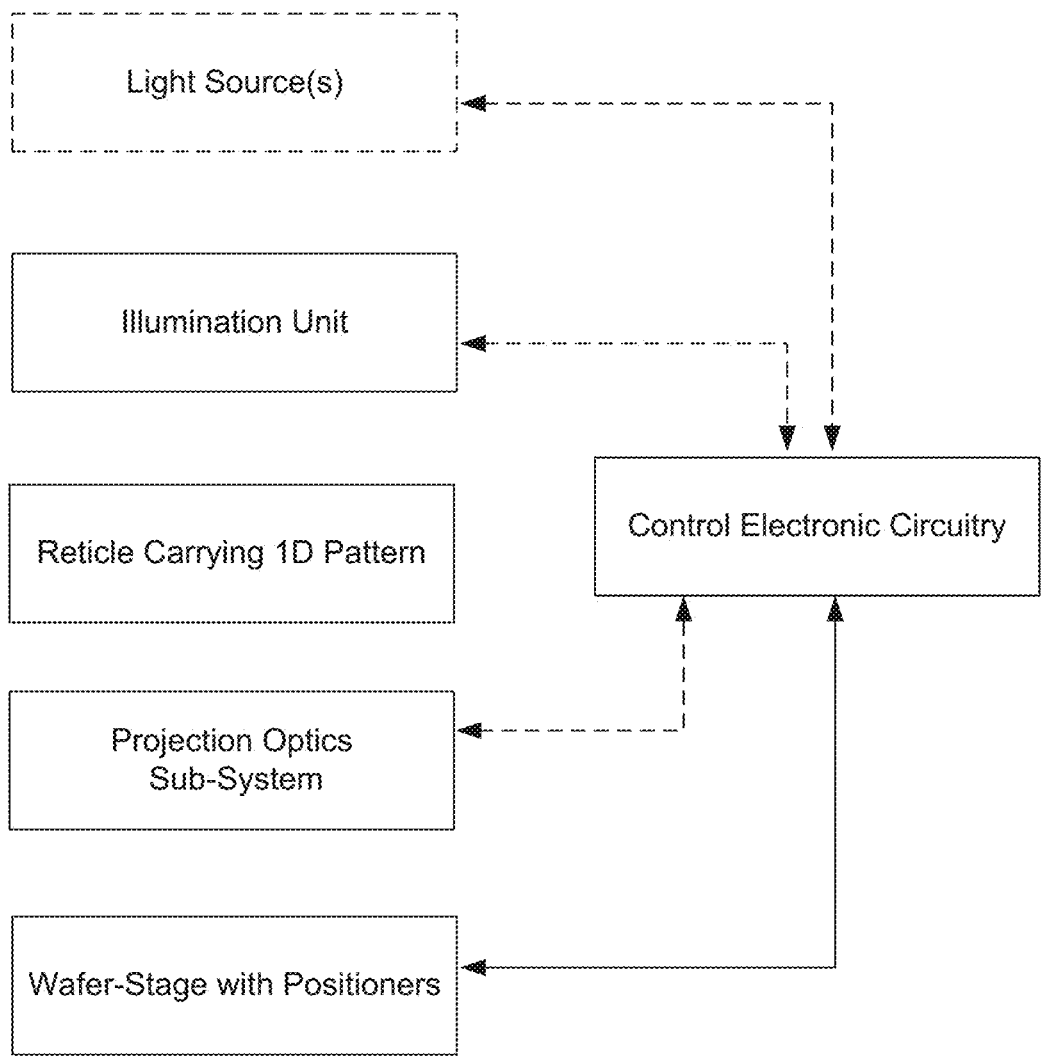
FIGS. 1A and 1B provide a generalized schematic of an embodiment of the invention.

The sizes and relative scales of elements in Drawings may be set to be different from actual size and scales to appropriately facilitate simplicity, clarity, and understanding of the Drawings. For the same reason, not all elements present in one Drawing may necessarily be shown and/or labeled in another.

DETAILED DESCRIPTION

In accordance with preferred embodiments of the present invention, an EUV exposure tool and methods are disclosed for lithographically-marking a chosen substrate (and, in a specific case—a substrate already carrying a lithographically-defined pattern, and in a specific case—a spatially-distorted pattern) with a new one-dimensional pattern containing spatially-densely packed parallel lines.

As used herein, and unless specified otherwise, the term "one-dimensional pattern" (or, "1D pattern") refers to a geometric pattern which is defined on a surface of a photomask or reticle (in order to be transferred with the methods of photolithography to a light-sensitive photoresist on the substrate of choice, such as semiconductor wafer, to create an image of such 1D pattern) and generally extending across such surface along two axes that are transverse to one another. The 1D pattern may change along a first axis of the pattern while remaining substantially unchanged along the second axis (that is, the 1D pattern may be characterized by geometrical changes along the second axis the value of which does not exceed 50% of the changes observed along the first axis, preferably does not exceed 20% of changes observed along the first axis, more preferably does not exceed 10% of changes observed along the first axis, even more preferably is within 5% or less of changes observed along the first axis, and most preferably is within 1% or less of changes observed along the first axis). An example of a 1D-pattern is provided by any collection of spaced-apart essentially identical, parallel, elongated pattern elements (such as, a combination of straight parallel lines or slits in an otherwise opaque screen defined at the photomask, for example). In a specific case the 1D-pattern at hand may form a linear (1D) grating (such as a 1D diffraction grating) characterized by periodically-changing amplitude along a first chosen axis and constant amplitude along a second axis chosen to be transverse to the first axis). Furthermore, as will be appreciated by those skilled in the art, to correct for imaging distortion(s) caused by the optical system or deformations of the substrate, the 1D pattern may nevertheless have small variations along first and/or second axis. For the purposes of this disclosure, an element or component containing a substantially 1D pattern (and regardless of the specific configuration of such element or component, whether as a reticle or mask, for example) may interchangeably be referred to as a pattern-source.

In comparison, the term "two-dimensional pattern (2D pattern)" is defined to represent a collection of pattern elements the variation or change of which is necessarily defined along both mutually transverse axes. One of the simplest examples of a 2D pattern is provided by a grid or mesh (which, when it has spatial periods defined along two transverse axes, forms a 2D grating). In reference to a pattern of a photomask of reticle as disclosed herein, the 1D and 2D patterns are considered as such regardless of the curvature of a surface of a substrate (or photomask) on which they are formed. For simplicity, an EUV system of the invention (in which an embodiments of the objective discussed here is intended to be used) is specifically and purposefully structured to image 1D reticle patterns, and is referred to herein as a 1D EUV system. For simplicity and in contradistinction, an EUV system configured to provide for imaging of a 2D-patterned reticle (such as a general-purpose EUV system) may be referred to as a 2D EUV system.

Embodiments of the invention provide solutions to a complex of practical problems encountered in related art with the use of 2D EUV systems:

A problem of current unavailability of a cost-effective lithography method and system configured to print periodic features of 10 nm (and smaller) pitch in manufacture of advanced semiconductors is solved with a design of an EUV exposure tool structured to optically image a spatially-dense pattern of a high-quality linear gratings (interchangeably referred to herein as "dense lines") with the use of 1) EUV light; 2) a reticle configured (on an appropriate reticle stage) to be (2i) located in a substantially fixed relationship with respect to the illumination and projection subsystems of the exposure tool and (2ii) non-scanning, in contradistinction with that of a general-purpose EUV system, and (2iii) carrying a substantially linear diffraction grating thereon (which may be an amplitude grating or a phase grating); 3) a projection optic system with NA of 0.40 to 0.60 and obscuration of 20% to 40% (in terms of NA; the pupil obscuration is, therefore, a squared value); and 4) a scanning wafer stage.

A problem presented by lack of proper matching overlay between an image of a reticle pattern and other patterns that already exist on a wafer is solved with the use of the 1D EUV system of the invention by appropriately adjusting the trajectory of scan of the wafer-stage, and by judiciously varying the optical magnification and "magnification tilt" (the latter term denoting linear variation of the magnification across the exposure field) of the reticle pattern during the process of scanning and exposing the wafer. In doing so, the problem of geometrically matching a continuously-scanning exposure field to the distortion of layers printed with conventional tools (the operation of which creates discontinuities between adjacent shots) is solved by optionally scanning every stripe on the wafer twice, exposing every other shot in the first pass, and the alternate shots in the second pass.

A persisting problem of insufficient-quality stitching between immediately-neighboring exposure fields formed on the wafer is solved by including into the 1D EUV system of the invention a "blind" field stop, that is positioned in proximity to one of the reticle, the wafer, and an intermediate image plane and that is judiciously shaped to define a perimeter of an individual exposure field in such a fashion as to create a spatially-consistent, regular exposure across the entire exposed area of the wafer. In a specific case, the blind field stop contains an aperture with a polygonal perimeter.

A persisting problem of insufficient level of illumination typical for an exposure tool utilizing EUV light is solved in a dense-line 1D EUV lithography system of the invention by providing an illumination optics assembly with (1) first and second reflectors containing arrays of faceted fly's eye reflectors, and (2) a relay mirror disposed between such reflectors and the reticle. In such 1D EUV system, the shape of one of the fly's-eye-array reflectors preferably matches the shape of the entrance pupil of the projection optics assembly optimized for two-beam interference across the whole range of pitch values characterizing the 1D reticle pattern.

A persisting problem of insufficient level of illumination typical for an exposure tool utilizing EUV light is solved in a dense-line 1D EUV lithography system of the invention by providing an illumination optics assembly with (1) first and second reflectors containing arrays of faceted fly's eye reflectors, and (2) a reticle the surface of which has a finite radius of curvature (that is, is curved) and contains a substantially linear diffraction-grating pattern thereon. In such 1D EUV system, the shape of one of the fly's-eye-array reflectors preferably matches the shape of the entrance pupil of the projection optics assembly optimized for two-beam interference across the whole range of pitch values characterizing the 1D reticle pattern. In addition, such 1D EUV system is designed to image each reflector of one of the fly's-eye-arrays to the entrance pupil of the projection optics assembly optimized for two-beam interference across the whole range of pitch values characterizing the 1D reticle pattern.

Implementations of the idea of the invention provide an exposure tool or machine configured to optically transfer dense line patterns at high resolution (which, in the case of periodic line patterns corresponds, for example, to a pitch or period of ten to twenty nanometers, preferably less than 10 nanometers, more preferably several nanometers, for example 5 nanometers or fewer) in a cost-effective way to enable 10-nanometer and 7-nanometer node semiconductor devices (defined according to International Technology Roadmap for Semiconductors, for example ITRS 2.0). The idea of the invention stems from the realization that modern, high density semiconductor chip designs are increasingly based on 1D geometrical patterns. 1D EUV system embodiments of the present invention, specifically structured to optically image 1D patterns (such as patterns representing 1D gratings) from a reticle to the substrate of interest, possess clear structural and operational advantages over the general-purpose 2D EUV systems in that:

The optical system(s) of a 1D EUV system are substantially simplified as compared to those of a 2D EUV system and can afford to include fewer mirror surfaces, which in practice provides for good quality exposures with less optical power required from the light source (e.g. several tens of Watts, in one example as low as about 20 W).

Due to the 1D nature of the reticle pattern to be transferred onto the semiconductor wafer, (a) a need to scan a reticle stage with respect to the wafer stage is no longer present; accordingly, the reticle stage or support of present embodiments does not include a scanning stage with long mechanical stroke; (b) In a specific case, the reticle pattern defines a linear grating and can be formed by a substantially linear diffraction grating (a binary, pure amplitude grating, or a pure phase grating). In a specific implementation, where the reticle is formatted to be a phase grating, the diffraction efficiency of the 1D EUV system is greatly improved, thereby increasing effective product throughput; (c) Since the optical imaging of a 1 D reticle pattern is reduced to, essentially, 1D imaging—that is, since spatial variations of an image formed on a resist carried by the substrate exist in only in one direction, the 1D EUV system is subject to more relaxed requirements on optical aberrations of the PL (as compared to those of the conventional 2D EUV system).

As a result of eliminating, from the optical train of the system, of some or even many optical surfaces (as compared with the 2D EUV system), the scanning reticle stage, pellicle, and other elements, the cost of the proposed EUV grating machine can be much lower.

It is also appreciated that, since the exposure of any point on the wafer is a result of an integration of light traversing the reticle at different points across the reticle, minor defects and particles on the grating pattern of the reticle do not significantly impact the exposure. For example, a micron-sized particle or pattern defect on the reticle would destroy the fidelity of an image printed by a 2D EUV system, but will only produce a negligible change in exposure dose for a 1D EUV system where the size of the exposure field is several millimeters or more.

According to the idea of the invention, one embodiment of the 1D EUV system is configured at least to utilize an EUV light source structured to deliver at least 20 W of optical power to the IU with a central leaf-shaped monopole illumination pattern;

to provide for optical imaging of 1D patterns in a pre-defined direction (optionally, to facilitate exposing patterns in different orientations for different layers; for example, a vertical orientation of a given 1D pattern on a first layer and a horizontal orientation of the 1D pattern on a second layer, the substrate can be rotated by 90 degrees for exposure of some layers) from a reflective or transmissive reticle onto the substrate (preferably having a diameter of 300 mm or more), with a pitch of the image formed in the resist of 20 nm or less and without printing any alignment or field kerf marks;

to define the operation of the lithographic exposure, of the substrate, with the use of a PL that has a NA of 0.4 or larger and a central obscuration of 40% of NA or smaller and a throughput of at least 50 wafers per hour (wph); preferably 70 wph; more preferably 100 mph; even more preferably more than 100 wph) at an irradiation dose, as measured at the wafer plane, of about 30 mJ/cm$^2$. In one implementation, the exposure field (on the substrate) is configured to be diamond-shaped for reliable and repeatable stitching of immediately neighboring fields;

in one implementation, to employ optical adjustments implemented via mag-tele shifts; and to ensure the overlay between the printed layer and the layer below with a mean+3 sigma value of 1.7 nm or less.

Details of various embodiments, portions, components of the overall system are discussed in several priority provisional applications (identified above; aggregately—"Our Prior Applications"), the disclosure of each of which is incorporated in this disclosure by reference.

General Schematic of an Embodiment of the 1D EUV System

Figure 1B:
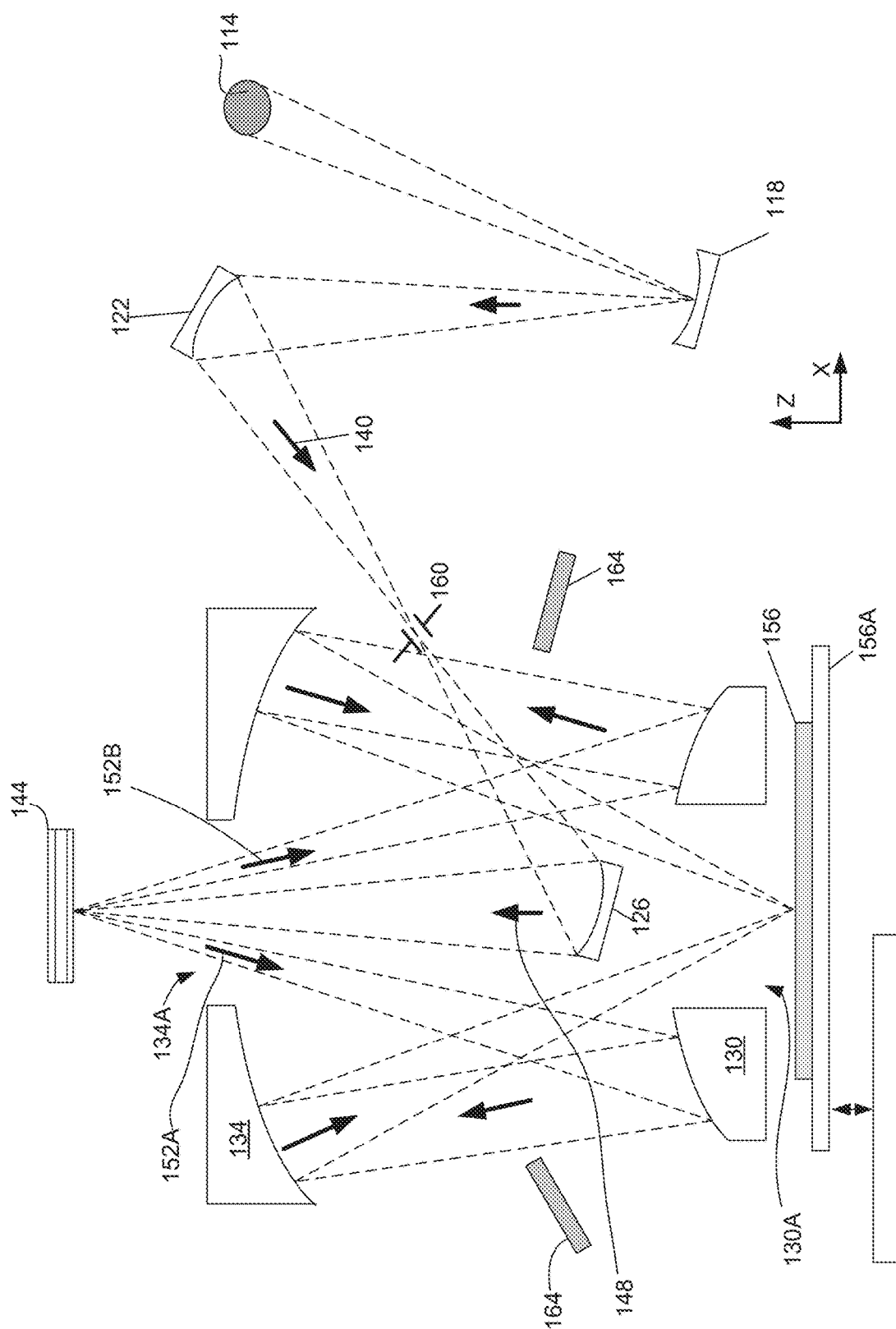

A generalized schematic diagram of an embodiment 100 of the 1D EUV system configured according to the idea of the invention is shown in FIGS. 1A and 1B. The system may include one or more EUV light sources (as shown—the light source 114, operating, for example, at 13.5 nm wavelength). The system includes an optical illumination sub-system or unit (IU) including first and second reflectors 118, 122 and a relay reflector 126; and a PO sub-system a reflective objective reflectors including two or more mirrors, at least one of which has an area defining an optical obscuration (a two-mirror objective is shown to contain first and second mirrors 130, 134, each containing a corresponding central obscuration 130A, 134A). The term optical obscuration is used herein to refer to at least a portion (of an optical element), within the bounds of which the further transfer of light incident onto an optical element to the next in line optical element is prevented or even blocked. Non-limiting examples of obscuration in a case of the reflective objective as shown are provided by (i) a through-opening in the substrate of the curved mirror (such as a curved primary mirror 130A, for example), within the bounds of which light incident onto such mirror is not reflected further toward the curved secondary mirror 130B but instead is transmitted through the through-opening, and (ii) the lack of reflective coating within the predetermined area of a mirror (substantially defining the same optical effect). The term central obscuration defines an obscuration centered at an optical axis.

The reflector 118 collects radiation 150 emitted by the light source(s) 114 and transfers it via reflection off the reflector 122 to the relay mirror 126 as radiation 140. The system further includes a pattern-source 144 (configured in this example as a reticle) disposed in optical communication with the IU and PO. The pattern-source 144 carries a spatially-dense 1D pattern and is positioned such as to be irradiated with radiation 148 delivered from light source(s) 114 and reflected to the pattern-source 144 through the obscuration 134A by the relay reflector 126. As shown, the pattern 144 is a photomask operating in reflection (in a related embodiment the reticle can optionally be configured as a transmissive reticle). It is also intended that, depending on a particular implementation of the system 100, a surface of the substrate of the pattern-source 144 that carries the 1D pattern thereon may be curved (in which case the reflective pattern-source has a non-zero optical power and can be referred to as a curved pattern-source) or flat (in which case the reflective pattern-source has zero optical power and can be referred to as a flat pattern-source).

Furthermore, the 1D pattern on the reticle may be distorted in a way to compensate for undesirable distortion of the PO. When the 1D pattern carried by the reticle is configured as an appropriately-dimensioned linear diffraction grating, the pattern-source 144 diffracts the incident thereon radiation 148 to form diffracted beams of light that include spatially-distinct beams 152A, 152B respectively representing diffraction orders (in one example, the +1 and −1 diffraction orders) and propagating towards the mirror 130 of the PO (the zeroth order of diffraction may be appropriately blocked from so propagating, as known in the art). In combination, the first and second reflectors 130, 134 of the PO redirect the diffracted beams through the obscuration 130A onto the workpiece or substrate of interest 156 to expose at least one layer of photoresist carried thereon with an image of the 1D pattern of the pattern-source 144. It is appreciated that, according to the idea of the invention, the reticle is disposed in a substantially fixed spatial and optical relationship with respect to the IU and PO sub-system in that both position and orientation of the reticle, once chosen and defined inside the 1D EUV exposure tool, are fixed (except for optional small adjustments that may be required to maintain focus and alignment). The term "substantially fixed" refers to and defines the spatial relationship and/or situation when a position of one component—the reticle, for example—the mechanical support of which is devoid of a structure configured to scan or move the reticle in a motion synchronized with a motion of the workpiece-stage or wafer-stage during operation of the exposure tool, may be, nevertheless, subject to small adjustments the magnitude(s) of which are sufficient to correct for errors in any of focus, magnification, and alignment during the operation of the exposure tool.

The system may also include a fixed-in-size or variable aperture 160 (for example, a variable slit of a particular shape; interchangeably referred to as "pattern blind" or "blind field stop" or simply "field stop") appropriately disposed within the IU (as shown—between the mirrors 122, 126); a pupil stop or aperture 164 (dimensioned to match the desired shaped of the entrance pupil of the PO); a stage/mounting unit supporting the reticle (not shown), a wafer stage 156A equipped with an appropriate stage mover (not shown) to provide for scanning of the wafer 156 with respect to the pattern-source 144 and the beams 152A, 152B, as required by the lithographic exposure process; and other auxiliary elements (e.g., vacuum chamber, metrology system, and temperature control system) as required. An x-axis is defined to be perpendicular to the axis along which the scanning is effectuated during the operation of the system, while y-axis is defined to be parallel to such axis of scanning. In the embodiment shown in FIGS. 1A, 1B, the 1D pattern comprises lines parallel to the Y axis.

Figure 5:
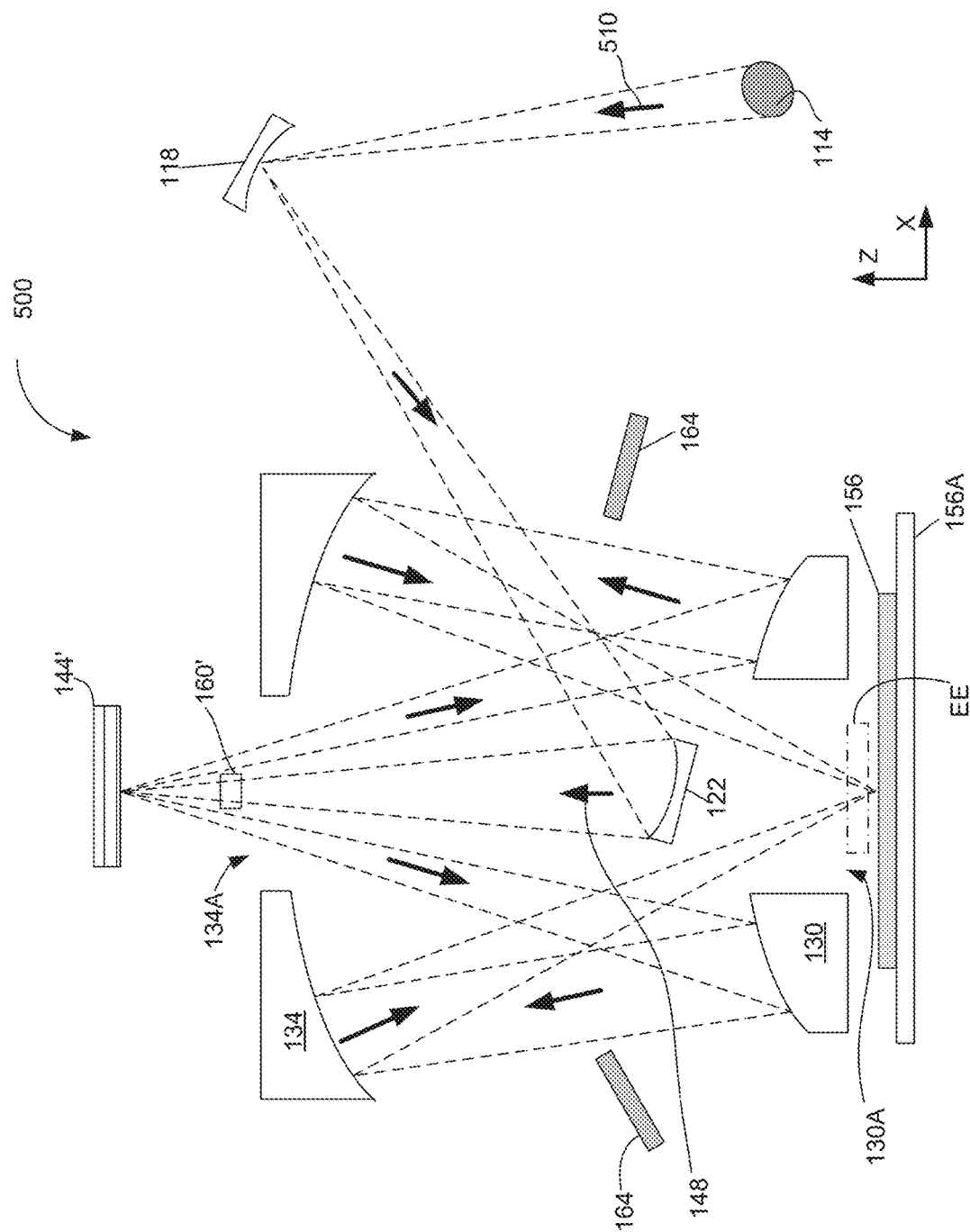
FIG. 5 presents an alternative embodiment of the system of the invention.
Figure 12:
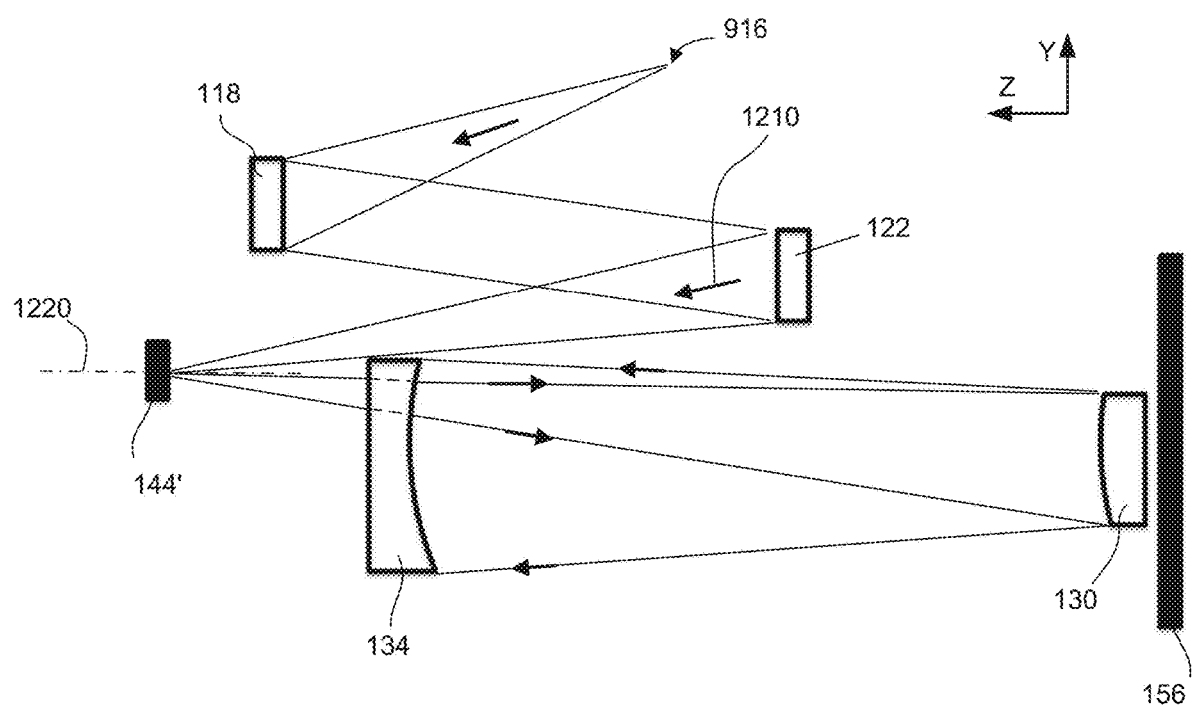
FIG. 12 illustrates schematically a portion of an optical train of an alternative embodiment of the 1D EUV exposure tool, according to the idea of the invention.

Different variations of the proposed implementation are within the scope of the present invention. For example, FIG. 5 schematically illustrates an embodiment 170 of the 1D EUV system in which—as compared to the embodiment 100 of FIG. 1B—the relay mirror 126 has been removed. This devoid-of-a-relay-reflector 1D EUV system is discussed in more detail below. FIG. 12 provides an illustration of yet another alternative implementation of the optical train of the 1D EUV system, in which the pattern-source (shown as 144' and having a non-zero curvature to a surface that carries the substantially 1D pattern) is illuminated off-axis, as discussed below.

Referring again to FIGS. 1A, 1B the 1D EUVD exposure tool is further complemented with a control unit (control electronic circuitry), optionally equipped with a programmable processor and configured to govern the operation of at least the wafer-stage and, in some embodiments, of at least one of the light source(s), IU, and PO sub-system. (FIGS. 5 and 12 do not illustrate the control unit for simplicity of illustration.)

Examples of Illumination Unit (IU)

According to the idea of this invention, in one example of embodiment the IU as a whole is configured to operably correspond to and optically work with the embodiment of the PO containing a 2-mirror (or, in a related embodiment, a 3-mirror) anastigmat as discussed below and in more detail in Our Prior Applications, and may include at least one reflector unit having a "fly's eye" structure. One implementation of the IU-design assumed a 16.5 mm wide diamond-shaped exposure field on the image surface (for example, a surface of a workpiece such as, in a specific case, a wafer disposed on a wafer-stage), which enables proper stitching of exposure fields. It was also assumed and implemented that the zero-order diffraction beam formed at the substantially 1D pattern of the pattern source 144 was blocked so that the optical interaction of the +1 and −1 order beams, forming an optical image of the substantially 1D pattern at the image plane doubled the spatial frequency of the 1D pattern in the optical image, and also allowed for near normal incidence illumination. (The appropriate blocking of the zero-order diffracted beam may be accomplished, when required, by the central obscuration in the PO or, as discussed elsewhere in this application, by using a dedicated radiation-blocking element.)

Figure 2A:
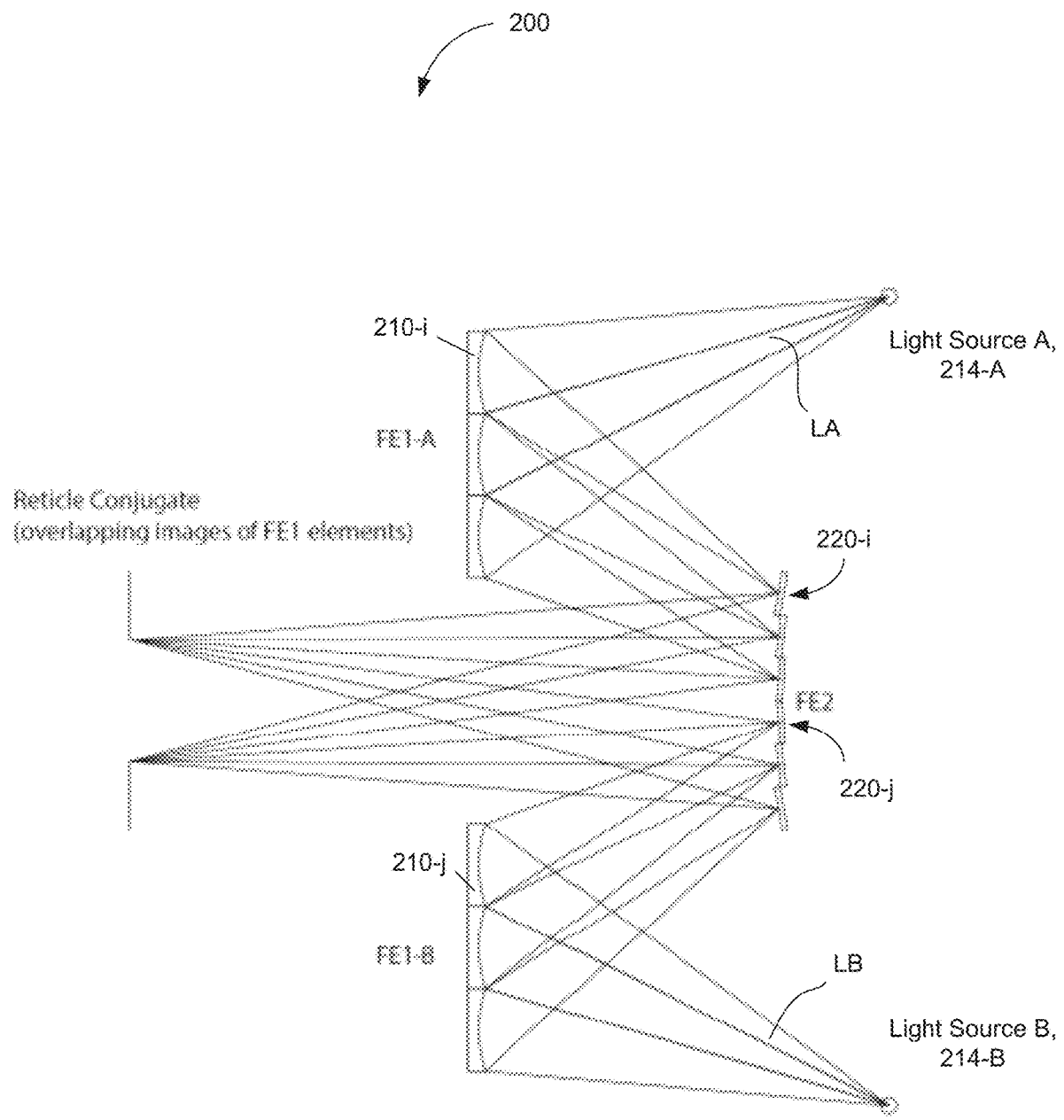
FIG. 2A illustrates, in side view, a schematic diagram of an embodiment of the illumination unit configured according to the idea of the invention.

The schematic diagrams representing some details of one embodiment of the IU are shown in FIGS. 2A, 2B, 2C. Additional details and/or embodiments are disclosed in Our Prior Applications. The specific example of the illuminator 200 is configured to operate with multiple sources of EUV radiation (as discussed below) and provide:

A judiciously-defined illumination pattern the shape of which was selected for maximum incoherence of light that accommodates no loss of contrast for an array of straight lines formed with a pitch of several tens of nm (for example, 20 nm to 30 nm). For example, the IU and the pattern-source are operably cooperated to form an illumination pupil (for the PO sub-system) that is defined by intersection of two plane shapes (such as shapes defining plane figures, in a specific implementation—two circles or disks). A goal of preserving the highest possible contrast is achieved by directing all of EUV radiation collected by the IU from the EUV source within the boundaries of the so-defined illumination pupil;

Two first fly-eye reflectors, FE1-A and FE1-B, of individual reflectors 210 that may have diamond-shaped perimeters, as shown in FIG. 2B; and A second "fly's eye" reflector array FE2 configured from tiles formed by reflectors 220 (having hexagonal or circular perimeters) to define a leaf-shaped aperture 224 and effectively combine radiation inputs LA, LB received from multiple sources of radiation 214-A, 214-B) while conserving etendue, and a curved relay mirror as part of the illumination unit;

Each of fly's eye arrays (FE1-A, FE1-B, FE2) of reflectors is configured to capture and reflect radiant energy acquired from a respectively corresponding radiant object with the use of a respectively-corresponding two-dimensional array of mirrors (alternatively referred to as "facets" or "eyes"). Such array of mirrors or facets may be referred to as a "fly's eye reflector" (or even a "fly's eye lens", as is sometimes done in the art) normally without the aid of an additional larger viewing lens and/or reflector. As shown, light from light source 214-A is captured by reflector FE1-A; light from light source 214-B is captured by reflector FE1-B; light reflected by FE1-A and FE1-B is captured by FE2. Each individual mirror forms an image of the radiant object as seen from the viewpoint of that individual mirror's location. Stated differently, there exists one unique element in FE1-A or FE1-B (but not both) associated with each element of FE2. As configured, therefore, each of the individual mirrors of FE1-A and FE1-B has a respectively-corresponding mirror in the FE2 array. For example, an individual reflector 210-$i$ of the array FE1-A forms an image of the light source 214-A at the individual reflector 220-$i$ of the array FE2, while the individual reflector 210-$j$ of the array FE1-B forms an image of the light source 214-B at the individual reflector 220-$j$ of the array FE2.

In the above-discussed design, there are only three sequential reflections of a light beam propagating through the illuminator, which leads to a dramatic improvement in optical transmission when compared to more complicated designs of related art, again because each mirror typically has a reflectance of only 65% to 70%. Compared to existing designs used in general-purpose EUV machines, the number of reflections is about half, so the amount of light transmitted through the IU of an embodiment of the invention is roughly doubled in comparison with that of the general-purpose EUV systems. Indeed, the transmission through a system can be estimates as a value of X^N, where X is the typical reflectance (65-70%) and N is the number of reflections. In conventional general-purpose systems, the IU has at least five (or more) mirrors, while an embodiment of the invention includes as few as 3 mirrors. Therefore, the IU transmission is increased from 11%-17% (for a general purpose EUV system with 5 mirrors) to 27%-34% for an embodiment of the invention. The effect is even more pronounced once the PO sub-system is considered, which uses about six mirrors in a general-purpose EUV system and only two mirrors in an embodiment of the invention. In this case, the transmittance of 0.9%-2% for a typical general-purpose EUV system (which includes the transmission through the IU and PO, but does not include the presence of the reticle) is increased by an order of magnitude to 12%-17% when an embodiment of the invention is used.

Figure 2D:
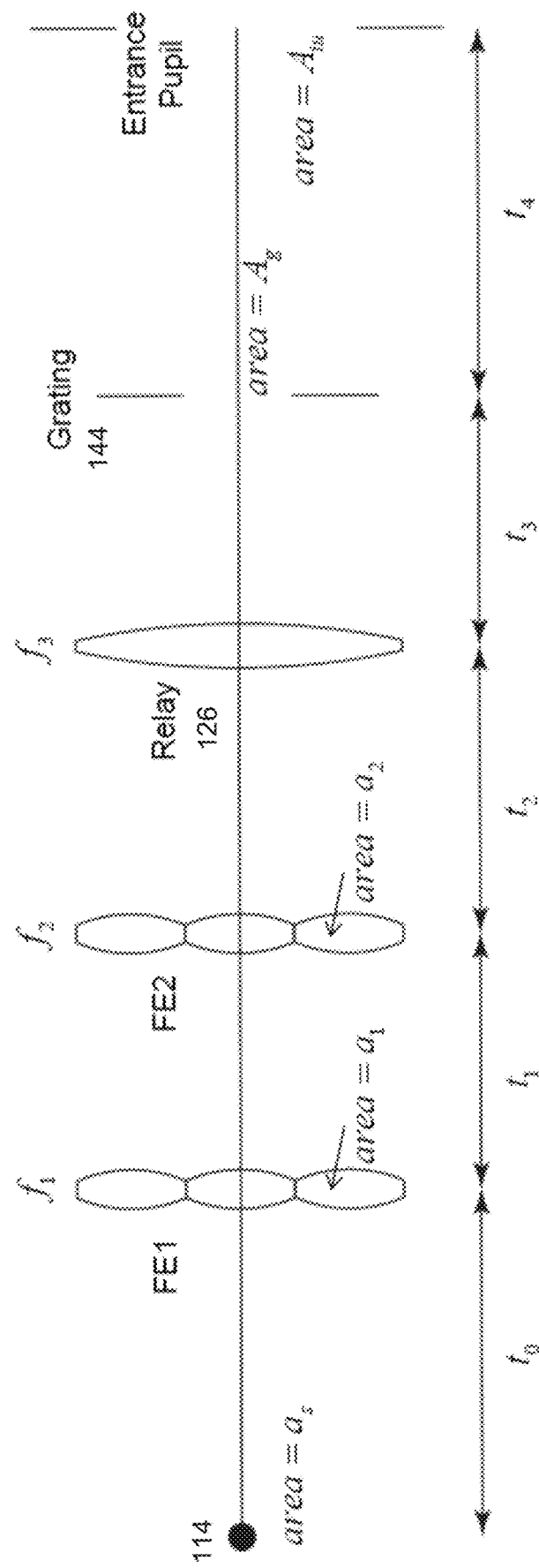
FIG. 2D illustrates a first-order layout of the embodiment of FIG. 2A, in which the reflectors are substituted by equivalent lenses.

In further reference to FIGS. 1, 2A, 2B, a first-order layout of the IU is schematically shown in FIG. 2D, where mirror elements (each having a specified surface area $a_i$ and focal length $f_i$) are drawn as equivalent lens-elements for simplicity of illustration. In general, it is appreciated that multiple arrays of FE1 mirrors are used to multiplex light received from multiple light sources to provide for etendue, of the IU, equal to $$H_{IU} = \frac{N_{FE} a_S a_1}{t_0^2} = \frac{N_{FE} a_1 a_2}{t_1^2} = A_g A_{iu} / t_4^2,$$

where $N_{FE}$ is the number of individual mirrors in FE2 array (and the sum of individual mirrors in FE1-A and FE-B).

In practice, the number of individual mirror elements in the FE2 array may be determined based on consideration of the required uniformity of light at the reticle 144 and filling of the entrance pupil of the PO. In one specific embodiment, the FE2 mirror array includes 98 hexagonal elements 220 (as shown in FIG. 2C), the angular width of each of which is 0.01996 rad as seen from the position of the wafer 156. The solid angle subtended by each of 220 elements, as seen from the wafer, is $3.451e^{-4}$ steradian, which leads to elemental etendue (associated with each of the 220 elements) of 0.04698 mm$^2$ sr (for a 16.5 mm-wide regular diamond shaped field, and the total etendue of 4.604 mm$^2$ sr for the whole FE2 array.

The angular size of an individual element 210 of the array FE1-A (or FE1-B, each of which has 98/2=49 individual micro-mirror elements) can be assessed with the knowledge of the angular size of the individual element of the FE2 array and the size of the light source:

$$\sqrt{3}/4 \delta\theta_1^2 d_S^2 = \sqrt{3}/4 \ \delta\theta''{}_2^2 L^2$$

$$\delta\theta_1 = L \delta\theta''{}_2/d_S = 0.07937 \text{ rad},$$

where $\delta\theta_1$, $\delta\theta''{}_2$ respectively represent the angles that the individual mirror elements of FE1 and FE2 subtend. The double prime signifies that it's the imaged subtended angle. L represents the distance from the pupil to the image plane, and $d_S$ represents distance from the source to FE1.

To complete the assessment of a first-order design of the 1D EUV system, the free parameters are additionally chosen: the distance from a light source to the corresponding FE1 array is chosen, in one specific implementation, to be $t_0$=500 mm; the distance separating the relay mirror 126 from the grating-reticle 144 is chosen to be $t_3$=1 m, while the distance between the FE2 array and the relay mirror 126 (corresponding to the unit-magnification imaging situation) is $t_2 = t_3 + t_4$. Distance from FE1 to FE2 is $t_1 = d_2 \cdot t_0 / d_S$ which is about 872 mm. It is appreciated that other sets of free parameters can be used to devise related embodiments.

Furthermore, the transverse dimensions of the FE1-A. FE1-B and FE2 arrays are set at:

FE1 width (corner to corner of a diamond): $d_1 = t_0 \delta\theta_1 = 39.7$ mm;

FE2 width (flat-size to flat-size of hexagon): $d_2 = d_2 p \cdot t_2 / (t_3 + t_4) = 7.24$ mm The total dimension across the FE1-A (or FE1-B) array is 8 elements, each 39.7 mm wide (corner to corner) in a specific example, aggregately of about 317.6 mm wide in x-direction as shown in FIG. B-2, or $9 \cdot 39.7/\text{sqrt}(2) = 252.65$ mm wide along the axis inclined at 45 degrees with respect to the x-axis in FIG. B-2. Generally, the width of an FE1 array along the x-axis is generally between 10 mm and 300 mm.

Width of the FE2 array: in a specific implementation of FIG. 2C, there are 7 individual 220 mirror elements across the array, each being 7.24 m wide, resulting in the FE2 array having a width of 50.68 mm along the x-axis as shown. Generally, however, such "waist" of the FE2 array is between 10 mm and 300 mm, preferably between 30 and 70 mm.

Width of the relay mirror 126 being 1 m away from the reticle 144, the relay mirror 126 subtends 0.125*0.429 rad in the x and y directions. The reticle 144, in the specific case, is 6*16.5=99 mm wide (corner to corner), resulting in 215 mm by 520 mm dimensions of the relay mirror 126. Generally, however, the dimensions of the relay mirror 126 are within the range between 100 mm-by-700 mm and 300 mm-by-400 mm.

Optical powers of the mirrors in one embodiment are chosen to be:

(A) for array FE1: $\phi_1=1/t_0+1/t_1=3.147$ m$^{-1}$ in one specific embodiment; generally, between 0.01 diopters and 100 diopters;

(B) for the relay mirror 126: $\phi_3=1/t_2+1/(t_3+t_4)=0.6299$ m$^{-1}$ in one embodiment; generally, between 0.01 diopters and 100 diopters;

(C) for array FE2:

$$\phi_2 = \frac{d_S(6L + t_0 dq_1 - t_0 t_3 dq_1 \phi_3)}{6Ld_2 t_0} = 1.3171\, m^{-1}$$

in one embodiment; generally between 0.01 diopters and 100 diopters. It is understood that the term optical power is a characteristic of a lens, mirror, or other optical system defining a degree to which such system converges or diverges the spatial distribution of light incident on it. The measure of optical power is equal to a value reciprocal to that of the focal length of the optical system.

It is appreciated that the proposed embodiment of the IU provides an image plane between the FE-2 reflector 122 and the relay mirror 126. This plane is optically conjugate with both the reticle 144 and the plane of the wafer 156, and provides an appropriate place to locate an (optionally variable in size) aperture 160 to control the dose of radiant power passed to the reticle 144 and to define the boundaries of the exposure field formed at the wafer.

Additional related embodiments of the IU configured according to the idea of the invention—and, in particular, an embodiment configured to operate with a single, only source of the EUV radiation—are discussed in Our Prior Applications.

Examples of a Projection Optics Sub-System

In one embodiment the 1D EUV system for projection lithography is configured to employ a PO portion that includes a 2-mirror system. The PO portion is complemented with a reticle carrying a substantially 1D mask pattern on a flat surface (for example, a reticle is formed by defining a 1D reflective diffraction grating on a plane-parallel substrate). The PO in such embodiment is configured to include a 2-mirror, monopolar (i.e., the distribution of light at any pupil plane comprises one "pole" or illuminated area) illumination sub-system. In a related embodiment, the PO includes a 3-mirror anastigmat.

Figure 3A:
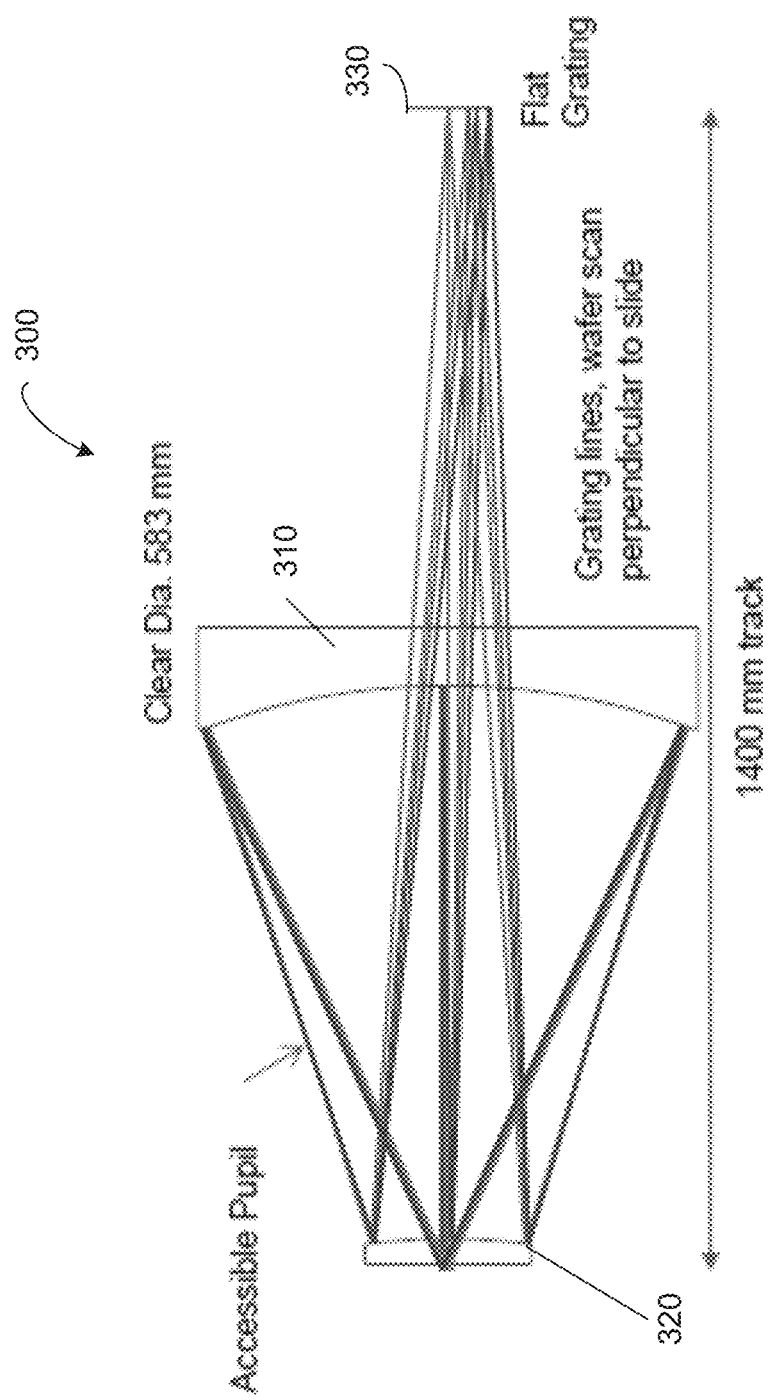
FIG. 3A shows an embodiment of a projection optic design.

In one specific implementation shown in FIG. 3A, for example, the 1D EUV system includes an anastigmatic projection-optic two-mirror system 300 configured to provide optical imaging with a de-magnification or reduction (of the reticle pattern, as a result of imaging) of 6×, NA=0.4, and a diamond-shaped exposure of 16.5 mm (diameter) by 5 mm on the wafer (16.5 mm denotes the field width in the X direction, normal to the scanning direction; 5 mm denotes the field length in the Y direction, which is parallel to the printed lines and the direction of the wafer stage scanning motion), within which the aberrations were small (about 12 milliwaves or less), when on-axis illumination is used. The chosen shape of such diamond-shaped exposure field is appropriate for stitching of immediately adjacent fields. The primary mirror 310 of this design has diameter of about 583 mm. The aspheric profiles of the mirrors 310, 320 were predominantly rotationally symmetrical, with very small astigmatic terms. No comatic Zernike terms were used in the case of on-axis illumination, but could be introduced in a specific case when the illumination is off-axis. The system further utilizes a flat reticle that is separated from the secondary mirror by a distance between about 800 mm and 2000 mm (as shown—about 1400 mm). The entrance pupil of the system 300 is at about 2.175 m from the reticle of the 1D EUV system (near the wafer/substrate), while the distance from the reticle to the mirror 310 is about 1 m. Parameters of Zernike aberrations used for simulations of the system 300 are listed in FIG. 3B). In so-implemented 1D EUV system, the beam of light from the light source experiences interactions with only six reflectors upon propagation towards the target substrate (two reflections at the reflector-arrays of the IU and one at the relay mirror, one reflection at the reflective reticle; and two reflections at the mirrors of the PO), thereby reducing the loss of optical power upon reflections as compared with the 2D EUV system and, therefore, reducing the requirement on how high the output power of the EUV light source should be. (Indeed, in a typical 2D EUV system the beam of light is reflected at least twelve times or more by the reflectors forming the optical train of the system.)

Since the pattern on the reticle comprises a 1D grating, incident light is diffracted approximately in the XZ plane. Therefore it is possible to configure each of the mirrors 310, 320 as two separate pieces which provide the necessary portions of a theoretically continuous, annular, curved reflective surface.

In a related embodiment, employing a primary mirror with the diameter of 835 mm and other components as described above, another flat-field 6× reduction was implemented, this time scaled up to a field diameter of 26 mm.

In another related embodiment, a 2- or 3-mirror PO sub-system was utilized in combination with a reticle formed by defining a 1D mask pattern on a curved substrate (that is, on a surface of a substrate having a non-zero value of curvature and, accordingly, a finite radius of curvature; for example, on a concave surface). The curvature of the wavefront of radiation incident on such reticle is changed upon interaction with the reticle.

Generally, a PO sub-system has a reference axis and is configured to receive, from the reflective pattern-source, the EUV radiation transmitted through the IU and to form an optical image of a substantially 1D pattern of the pattern-source with a reduction factor N>1 on a plane that is optically-conjugate with the pattern-source, with the use of only two beams of radiation that originate at the pattern-source in response to a beam of EUV radiation incident on it. Generally, the PO sub-system is configured to not reduce contrast of the optical image in a spatial-frequency-dependent fashion Additional details and/or related embodiments of the PO sub-system configured according to the idea of the invention are disclosed in Our Prior Applications. In some embodiments, the PO sub-system is designed to operably tolerate a certain level of optical aberrations. Stated differently, the PO sub-system may have residual optical aberrations that, if present, may include one or more of the following: field curvature of no more than 100 microns; any of spherical aberration, coma, and astigmatism not exceeding 0.1 waves; and distortion of no more than 20%. In some embodiments, the PO sub-system includes first and second reflectors, the first reflector having a first radius of curvature, the second reflector including a second radius of curvature, the first and second radii of curvature having opposite signs. The PO sub-system may include a catoptric system containing primary and secondary mirror sub-systems, at least one of which primary and secondary mirror sub-systems includes two reflecting elements spatially distinct (for example, spatially disconnected) from one another.

Elements of Pupil Construction

While elements of the pupil construction are detailed in Our Prior Applications, here some guidelines and parameter that are specific to a particular implementation are discussed.

Figure 4A:
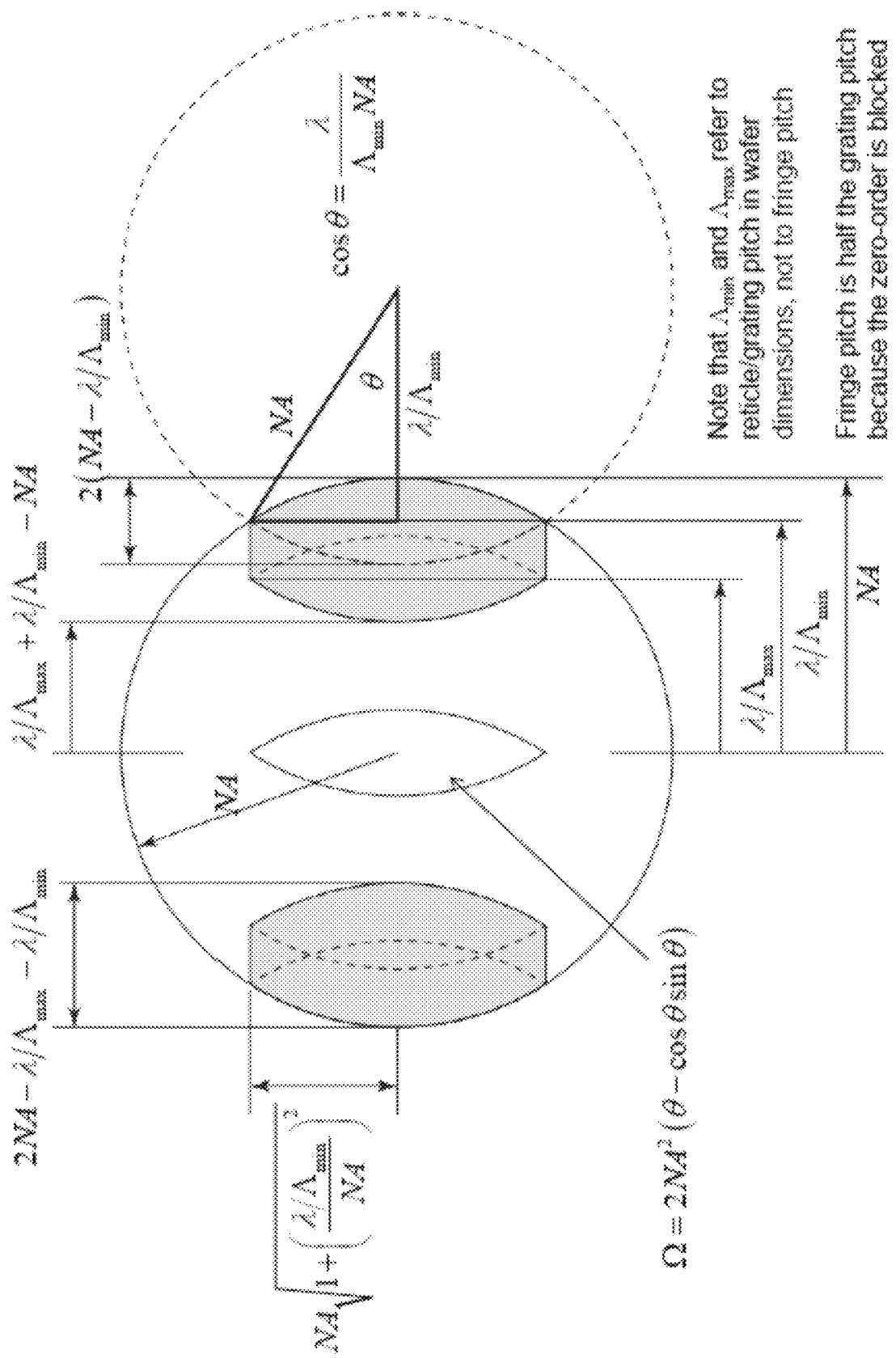
FIGS. 4A, 4B illustrate the determination of pupil parameters and related system for one embodiment of the invention.
Figure 4B:
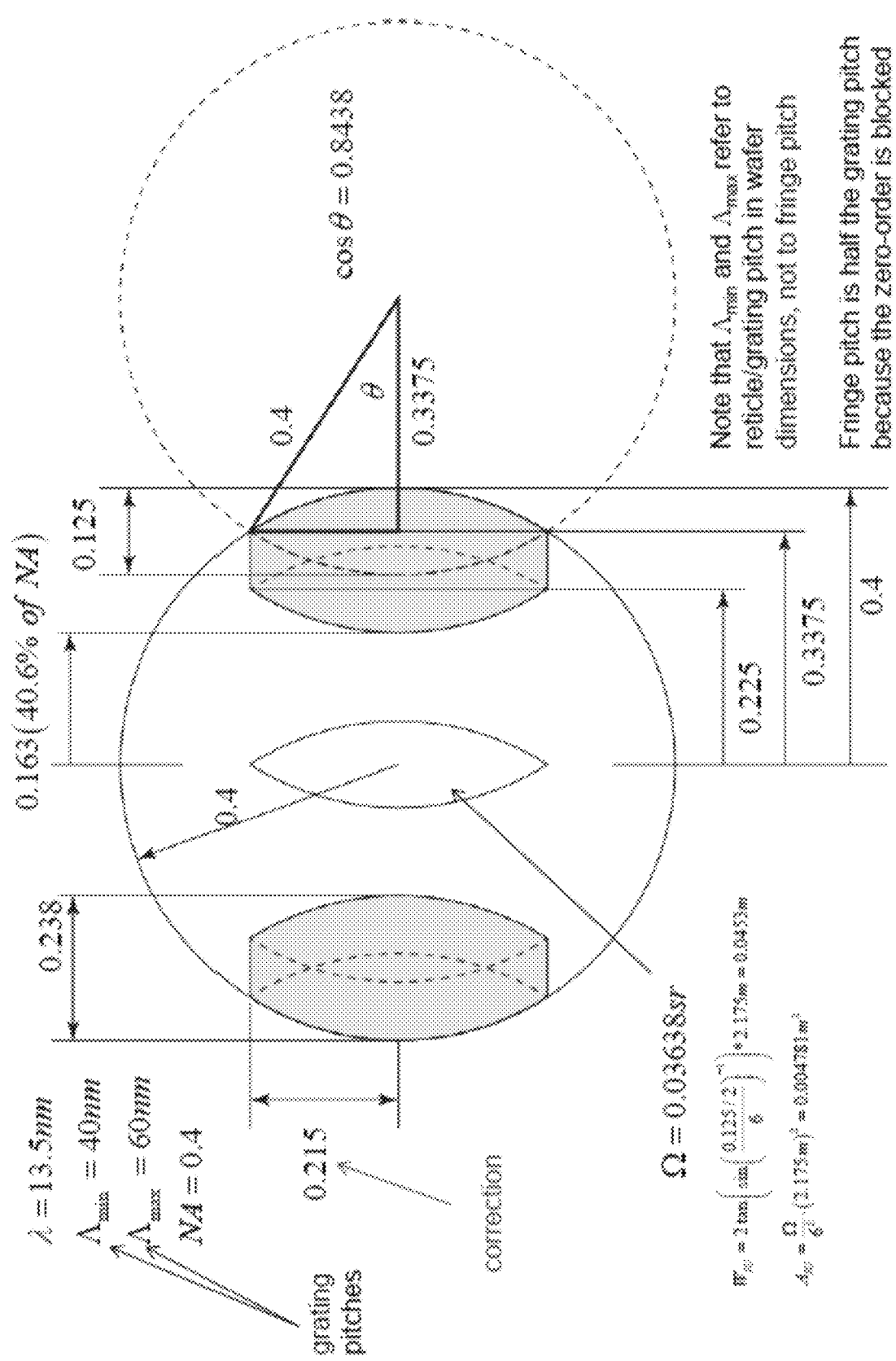

Construction of pupil of the embodiment of the invention and related dimensions is illustrated in FIGS. 4A, 4B based on the examples of parameters of the PO and IU presented above. With a 16.5 mm wide regular diamond-shaped (i.e., a square field oriented at 45° to the X and Y axes, with 16.5 mm long diagonals) field at the wafer and assuming the solid angle of Ω=0.03638 sr into which light is radiated from the light source (114, 214-A; 214-B) the etendue corresponding to the IU can be assessed at $$H_{IU} = \Omega A_{field} = 0.03638[sr] * \left(\frac{16.5[mm]}{\sqrt{2}}\right) = 4.952[mm^2 sr].$$

In further reference to FIGS. 1 and 2A; It is appreciated that the embodiment 100 (with details from 200) is appropriately configured to provide for optical elements 118 (FE1-A, FE1-B), 160 (blind field stop). 144 (reticle), and a surface associated with the wafer-stage 156A (for example, a surface of the wafer 156 supported by the wafer stage) to be optically-conjugate elements as understood in the art, in that points of one of these elements irradiated with light incident thereon are optically imaged, through the optical system of the embodiment 100, to corresponding points of another of these elements. The embodiment is structured to form overlapping images of FE1-A and FE1-B at the reticle element 144. The embodiment 100, 200 is also configured to have light source(s) 114 (214-A, 214-B), element 122 (FE2), and aperture stop (of the PO sub-system) to be optical conjugates. It is appreciated that FIG. 1B is a schematic diagram, and that degrees of divergence or convergence of a particular beam of light upon reflection from or transmission through a particular optical element of the system 100—which degrees may vary depending on a particular detailed design of the system 100—may not be represented accurately in the drawing.

General Schematics of Related Embodiments of the 1D EUV System

FIG. 5 schematically illustrates an embodiment 500 of the 1D EUV system, in which—as compared to the embodiment 100 of FIG. 1B—the relay mirror 126 has been removed, and a surface of the substrate of the reticle 144' (in a reticle-holder, not shown) that carries the grating pattern has non-zero curvature and, therefore, non-zero optical power. When the reticle 144' is structured to operate in reflection, the reticle 144' images the FE2 reflector 122 into the entrance pupil of the PO sub-system. Upon transmission from the light source(s) 114, a beam 510 of radiation traverses the field stop 160' that is disposed in close proximity to the reticle 144' (as shown) or, alternatively, in close proximity to the wafer 156 across a beam of radiation that was diffracted by the reticle-pattern towards the PO sub-system (as shown schematically with the dashed line EE. The proximity distance separating the field stop 160' from the reticle (or the wafer) is, generally, shorter than 3 mm, preferably shorter than 1 mm, more preferably shorter than 100 microns, and even more preferably shorter than 50 microns.

Blind Field Stop (Pattern Blind)

Figure 8A:
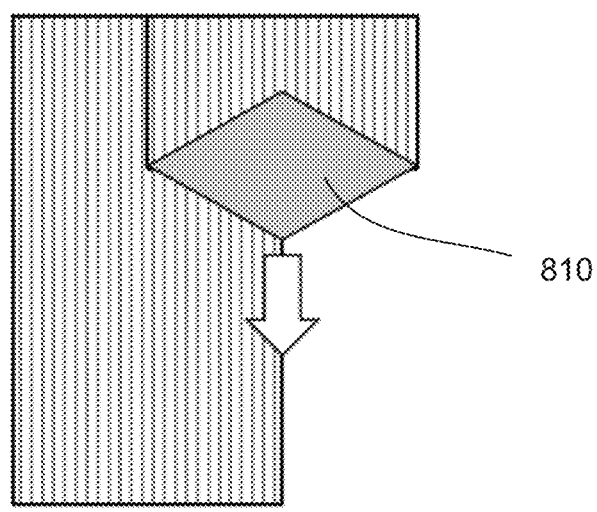
FIGS. 8A, 8B, and 8C illustrate examples of shapes of an exposure field formed by the system of the invention at an image surface. Each area of the image surface is at last scanned twice (along the arrows as shown)
Figure 8B:
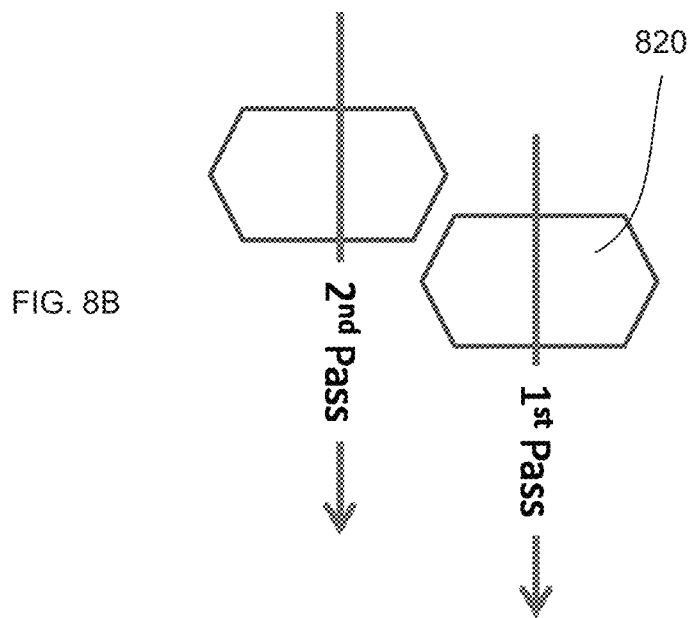
Figure 8C:
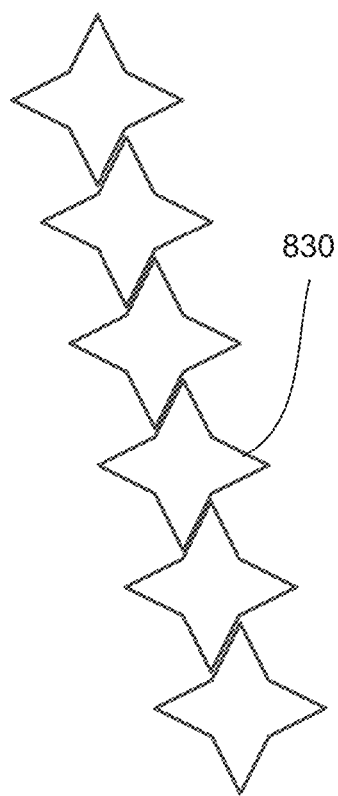

In reference to FIGS. 8A, 8B, 8C, the blind field stop 160 of the system defines an optical aperture structured to dimension the light beam such as to form an exposure field 810, 820, 830 (on the image surface 156) of a substantially polygonal shape, in specific cases—a rhomboidal shape (shown as diamond shape 810 in FIG. 8A) or a hexagonal shape (820, of FIG. 8B). It is intended that an exposure field and, therefore, an exposure-field-forming optical aperture can be defined by a concave polygon (830, of FIG. 8C). Accordingly, the perimeter of the aperture 160 of an embodiment 100, for example, is generally defined by a polygon. Such configuration addresses a practical problem of providing efficient spatial overlap between immediately neighboring exposure field to create a uniformly-exposed area across the entire image surface/wafer 156. In particular, as understood by a person of ordinary skill in the art, the polygonal shape facilitates the effective geometrical stitching of the images from subsequently-formed exposure fields. The orientation of the example exposure field shown, for example, in FIG. 8A on the substrate 156 is such that the diagonals of the polygonally-shaped exposure field 810 are parallel to the x- and y-axes of the system. While aperture 160 is shown in FIG. 1B to operate in transmission, it is understood that in a related embodiment the pattern blind 160 can be structured to reflect light within the bounds of the polygonal perimeter of its optical aperture.

It is appreciated that, depending on a particular type/shape of the polygonal exposure field, more than two exposure passes may be required across the image surface to fully and completely expose it without leaving any non-exposed patches. To this end, one advantage of having exposure field be shaped according to the embodiment 830 (which would require 6 passes to complete the exposure cycle) is that such implementation would allow the overall system to be more tolerant to field-dependent aberrations.

Additional details and/or embodiments are discussed in Our Prior Applications.

The size of the pattern blind does not affect the exposure time, and should be selected to match the total etendue of the illumination source(s). The wafer-stage scanning velocity is inversely proportional to the width of the pattern blind's aperture measured along the x-axis. Under some circumstances, it may be preferred that the aperture of the pattern blind has a high aspect-ratio shape (wide in X and very thin in Y), for example with an aspect ratio of 5 to 1 or higher.

The optical output required from the light source with which the 1D EUV system of the present invention may be equipped understandably depends on the amount of radiant power necessary for proper exposure of the resist on the wafer and economical throughput.

EUV Source and Radiant Power Considerations

One example of the source of light for use with the 1D EUV system of the invention may be provided by a plasma-based light source such as at least a portion of a laser-driven (laser-pumped) plasma light source described, for example, in U.S. Pat. No. 8,242,695 and/or U.S. Pat. No. 8,525,138. The disclosure of each of these patent documents in incorporated by reference herein. If necessary, the casing of the plasma source may be electrically grounded and/or restructured to change overall optical power delivered through the source's window. As a thermal source, such light source emits radiation in the UV spectral region, visible spectral region, and IR spectral region.

While the overall power of such source, emitted in the solid angle of $4\pi$ steradian, can be assessed to be about 10 W based on power leaving the light source through its clear aperture, the useful output from any light source appropriate for an embodiment is only that delivered to the aperture of the illuminator 200. Notably, the radiant-power output from a light source that is required for proper operation of the overall 1D EUV system also depends on the run-rate of the system (measured, for example, in a number of wafers processed within an hour, wph). An example of a map representing estimated required radiant-power output as a function of run-rate in the 1D EUV system was created based on assumptions of: a target run-rate of 100 wph; a double-pass over each portion of the wafer for a total dose of 30 mJ/cm$^2$; a square exposure field (oriented at 45° to the x- and y-axes, measuring 16.5 mm along both diagonals, see 210 in FIG. 2B); overhead time of 5 sec per wafer (primarily wafer exchange and alignment measurement); acceleration time of 5 sec total per wafer, 30 pulses minimum for each exposed area; six reflecting surfaces at 65% reflectance each, with 50% diffraction efficiency at the reticle; and an additional "geometrical factor" of possible 50% loss because of mismatched etendue between the illuminator and the PO. In other words, the "geometrical factor" is the fraction of the source output power that is directed into the PO entrance pupil. The map represents power required at the illuminator entrance for a given run-rate, as well as the required pulse-repetition rate and wafer-stage acceleration. Portions of such map are shown in FIG. 6 for specific values of the assumed parameters and for three different values of the geometrical factor. Table 1 additionally summarizes the results.

TABLE 1

Run rate model results:

| Run rate | Power @ illum., W | Rep rate, kHz | Stage avg accel, g | Scan speed, mm/sec |
|---|---|---|---|---|
| 100 | 43 | 0.60 | 0.50 | 165 |
| 80 | 32 | 0.45 | 0.37 | 122 |
| 60 | 23 | 0.31 | 0.26 | 86 |
| 40 | 14 | 0.19 | 0.16 | 54 |
| 20 | 7 | 0.09 | 0.08 | 25 |
| 10 | 3 | 0.04 | 0.04 | 12 |

It is appreciated that, depending on a particular choice of the source of light for use with an embodiment of the 1D EUV system the etendue of such source may be smaller than that of the IU. In this case, the system can be configured for use with multiple light source (for example 214-A and 214-B, as shown in FIG. 2A). The number of (otherwise identical) light sources required in this case can be estimated as $N_{sources} = H_{IU}/H_{single\ source}$, where $H_{single\ source}$ is the etendue of a single light source.

Figure 9A:
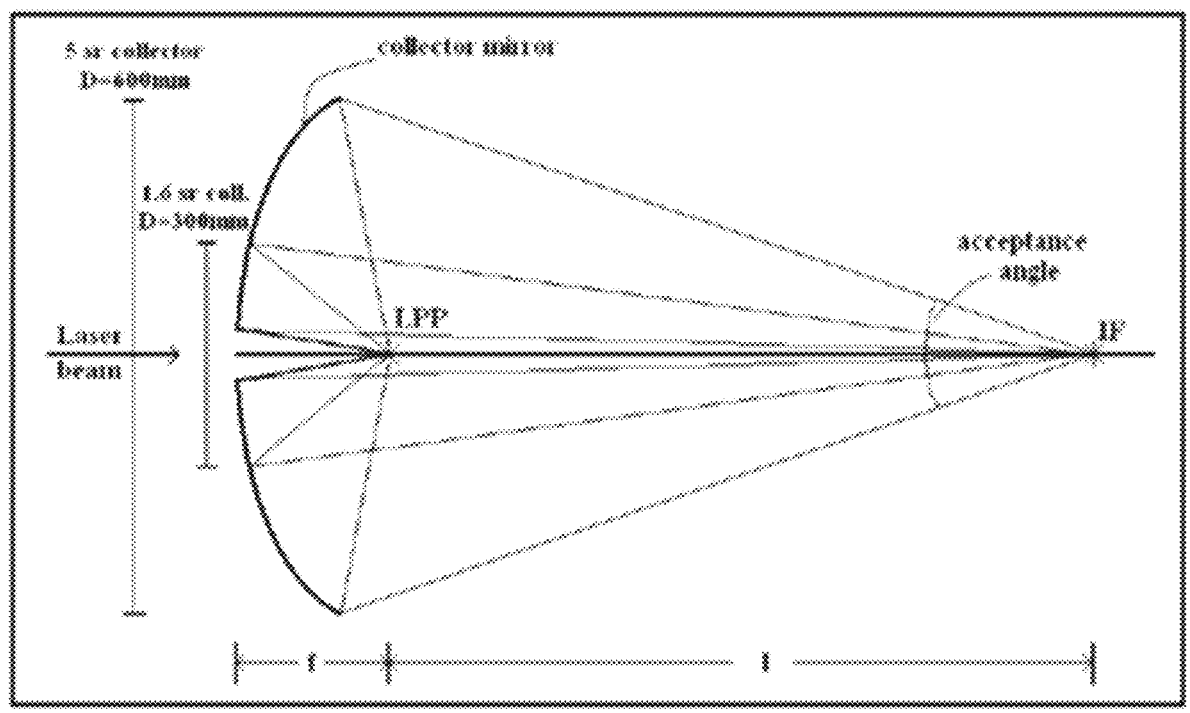
FIG. 9A illustrates a configuration of the light-collection system for a laser-driven plasma source of light with ellipsoidal mirror for refocusing the EUV radiation from the LPP to the IF (which, in turn, serves as a source of light for an embodiment of the IU of the invention). A 5 sr collector and a 1.6 sr sub-aperture configuration are shown schematically for comparison.
Figure 9B:
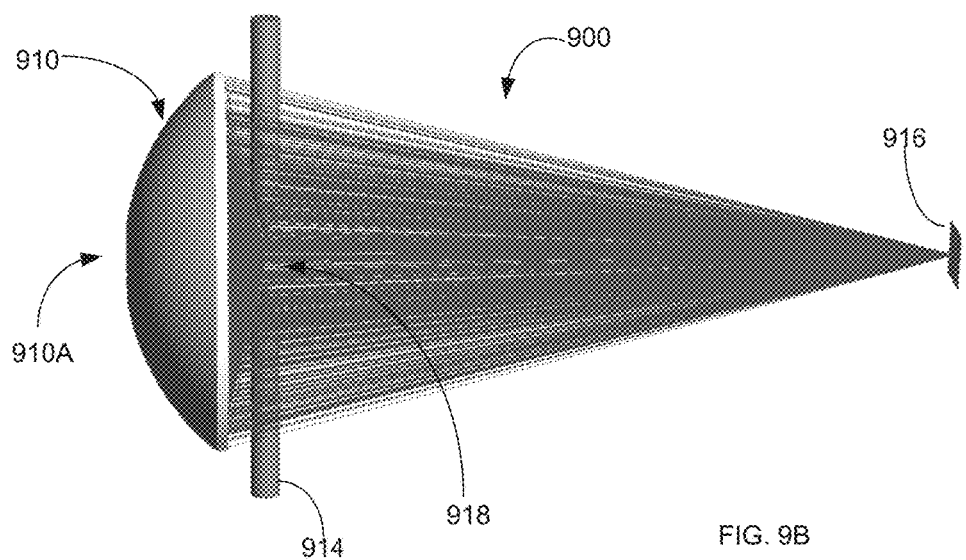
FIG. 9B is a schematic diagram of the ray-based model of laser-driven plasma source of FIG. 9A illustrating the collector 910 with the central opening 910A, tin jet 914, and the secondary source of light IF, 916.

Additional details and/or embodiments of the source of EUV radiation judiciously configured for operation in the 1D EUV system of the invention are discussed in Our Prior Applications. For example, an example of the light-collection schematic of such EUV source for use with the optical system of the 1D EUV exposure tool is shown in FIGS. 9A, 9B. FIG. 9A illustrates a configuration of a laser-driven plasma source of light with ellipsoidal mirror for refocusing the EUV radiation from the LPP to the IF (which, in turn, serves as a source of light for an embodiment of the IU of the invention). A 5 sr collector and a 1.6 sr sub-aperture configuration are shown schematically for comparison. FIG. 9B is a schematic diagram of the ray-based model of laser-driven plasma source of FIG. 9A illustrating the collector 910 with the central opening 910A, tin jet 214, and the secondary source of light IF, 916.

The specific model of the EUV source of FIGS. 9A, 9B included an aperture and an obscuration mask (formed by the combination of two circles and a rectangle) that set the boundaries of a Gaussian-shaped irradiance distribution of light that scales with distance from the IF 916.

Figure 9C:
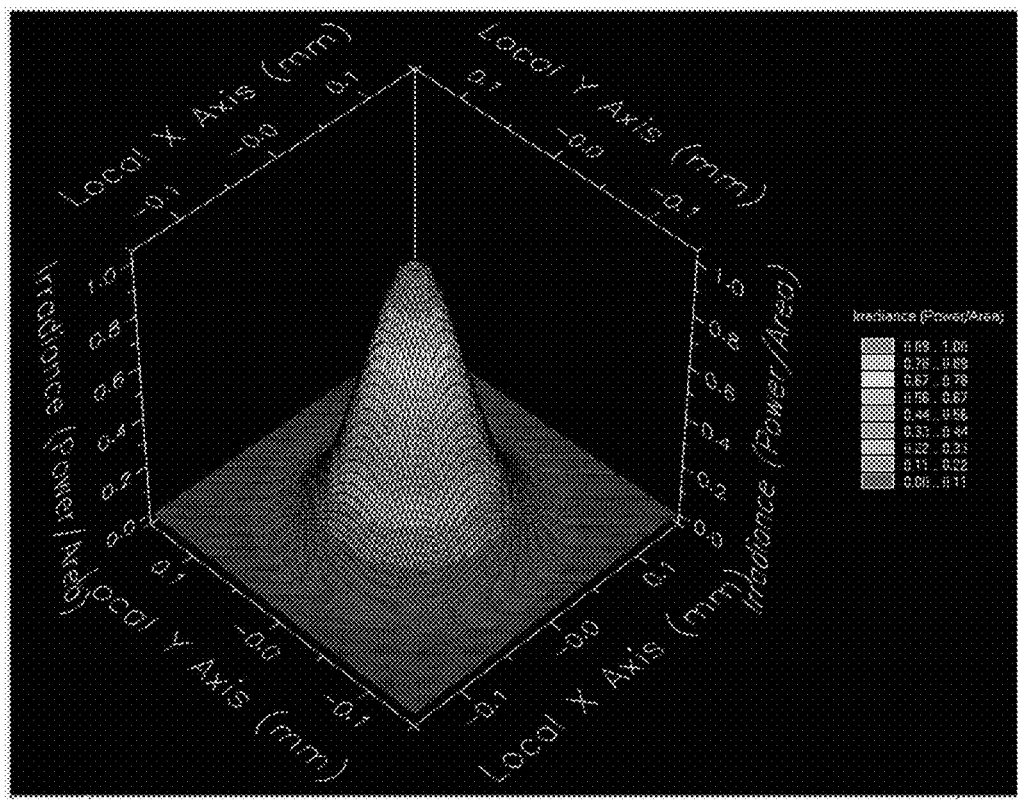
FIGS. 9C, 9D illustrate an assumed substantially Gaussian distribution of plasma of the laser-driven plasma source according to the model used for calculations.
Figure 9D:
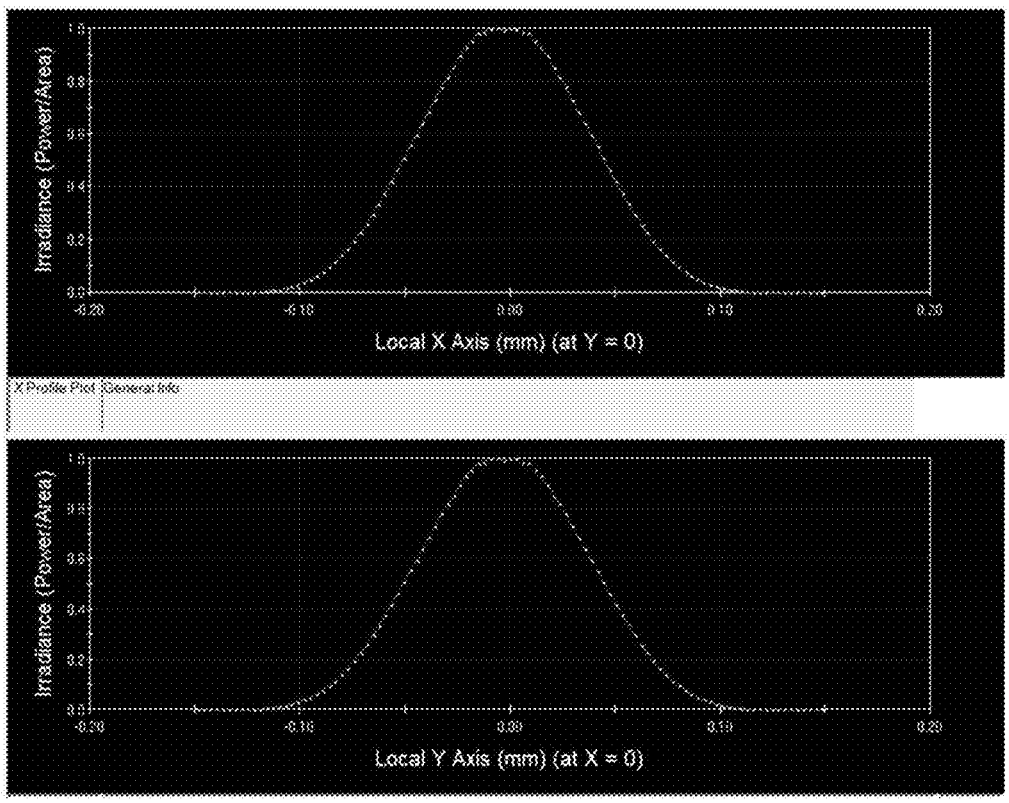
Figure 11A:
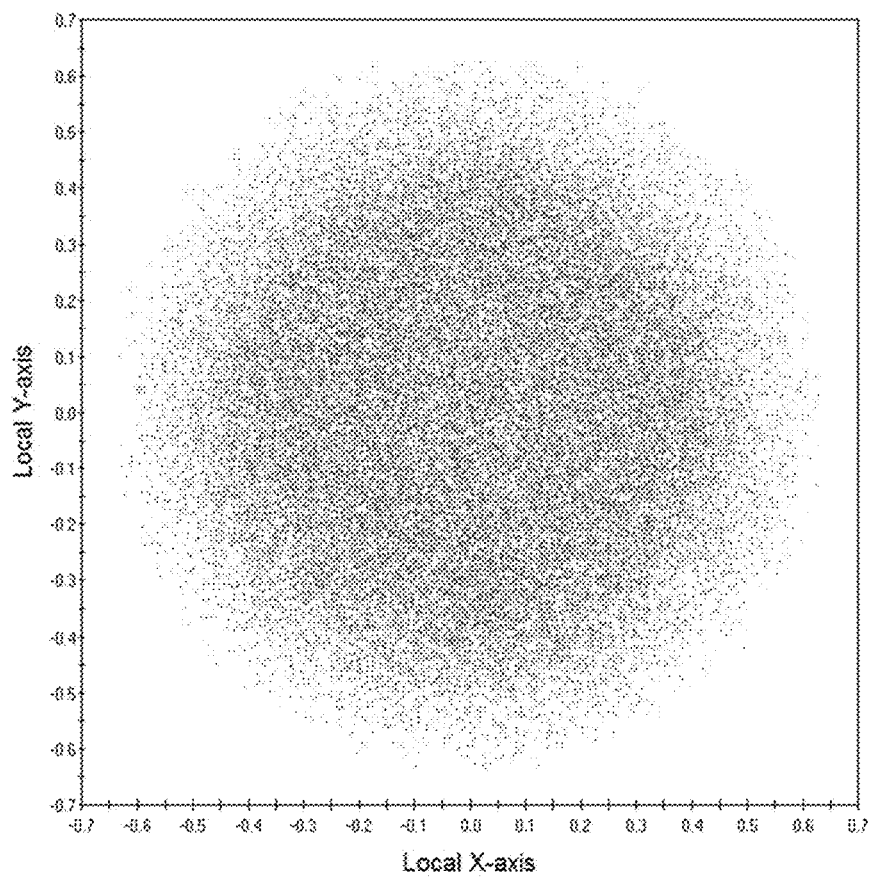
FIGS. 11A, 11B illustrate distributions of rays produced by the modelled laser-driven plasma source and directional cosines of such rays, respectively, at the plane of the secondary source of light passing through the point of convergence of the rays reflected by the collectors of the plasma source.
Figure 11B:
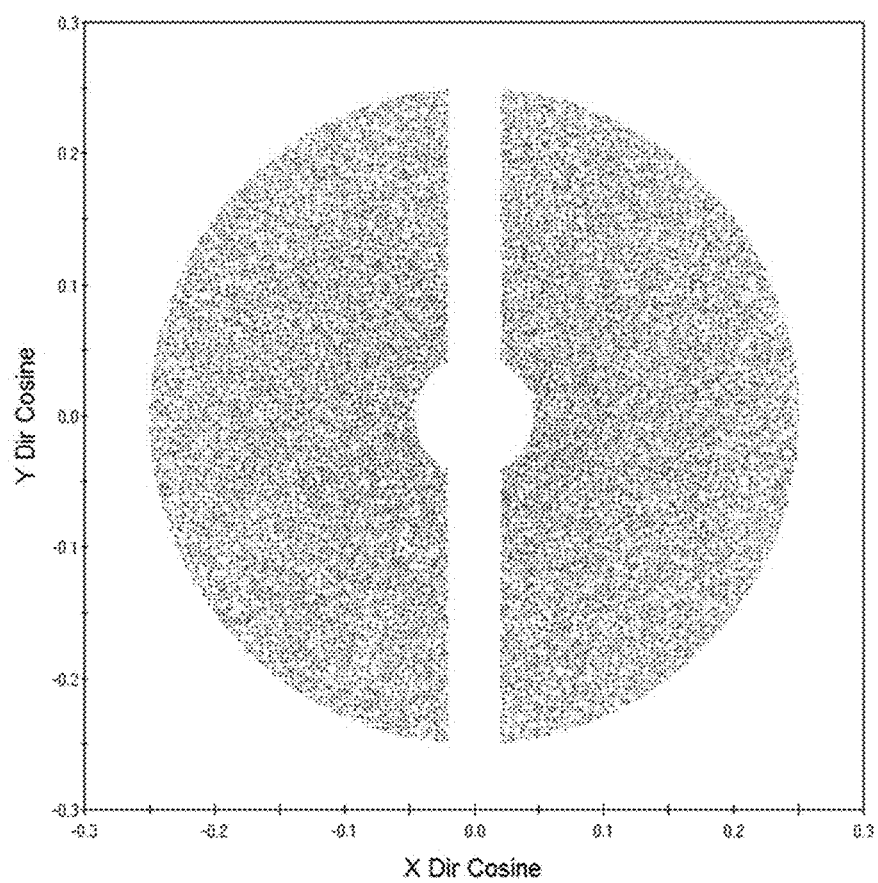

The model further included the effects of: i) Three-dimensional (3D) distribution of plasma emission 918; (ii) Elliptical mirror aberrations, obscuration, and reflectance variation; (iii) Obscuration caused by a tin jet 214. The model of the source was further assumed to have: a) a 650 mm diameter ellipsoidal collector, b) A source with NA defined by a 5 sr solid angle; c) Plasma 918 radiation distribution with a roughly Gaussian projection of 90 micron diameter at FWHM (or about 910 microns at 1/e2 level). The results of the simulated projection of such distribution with FRED® is presented in FIGS. 9C, 9D; d) The IF 916 with NA of 0.25; e) A 20% central disc-shaped obscuration 910A (about 130 mm diameter); and f) a 15% linear obscuration caused by the tin jet 914 (100 mm width). The reflectance of the collector 910 was assumed to be about 50%, the effective diameter of the IF 916, allowing for instability of the lase-driven plasma source, was assumed to be about 2 mm. The modelled spatial distribution of light produced by the plasma source and that at the plane of IF 916 can be assessed from FIGS. 10A, 10B illustrating the intensity distribution, the ray-spot diagram at the plane of IF 916 shown in FIG. 11A, and the diagram of ray directions at the same plane as shown in FIG. 11B.

Considerations for a Lithographic Process with the Use of an Embodiment of the Invention When the mask (reticle) 144 used in an embodiment of the 1D EUV system of the invention is configured as a phase-shift mask (PSM) to increase contrast of the image formed at the substrate, the resulting features of the image as printed are improved as compared to those achieved with the use of a conventional 2D EUV system.

Simulations of the proposed 1D EUV system were conducted under imaging simulation conditions summarized in Table 2. For comparison, related parameters of 2D EUV systems of related art are listed as well.

TABLE 2

Imaging simulation conditions.

| Parameter | Embodiment of 1D EUV tool | 0.33-NA tool (2D EUV tool of related art) | 0.55-NA tool (2D EUV tool of related art) |
|---|---|---|---|
| | Feature | 10 nm line on 20 nm pitch | |
| Mask type | Chromeless PSM (phase-shift mask) | Binary | Binary |
| Illumination | Central oval (FIGS. 2B, 2C), σ = 0.1 wide by 0.4 long | Dipole, 0.2σ wide on 0.9σ circle | Dipole, 0.2σ wide on 0.6σ circle |
| Central obscuration | 30% (less than 40%) | None | 20% |
| Aberrations | From design | None | None |

Figure 7A:
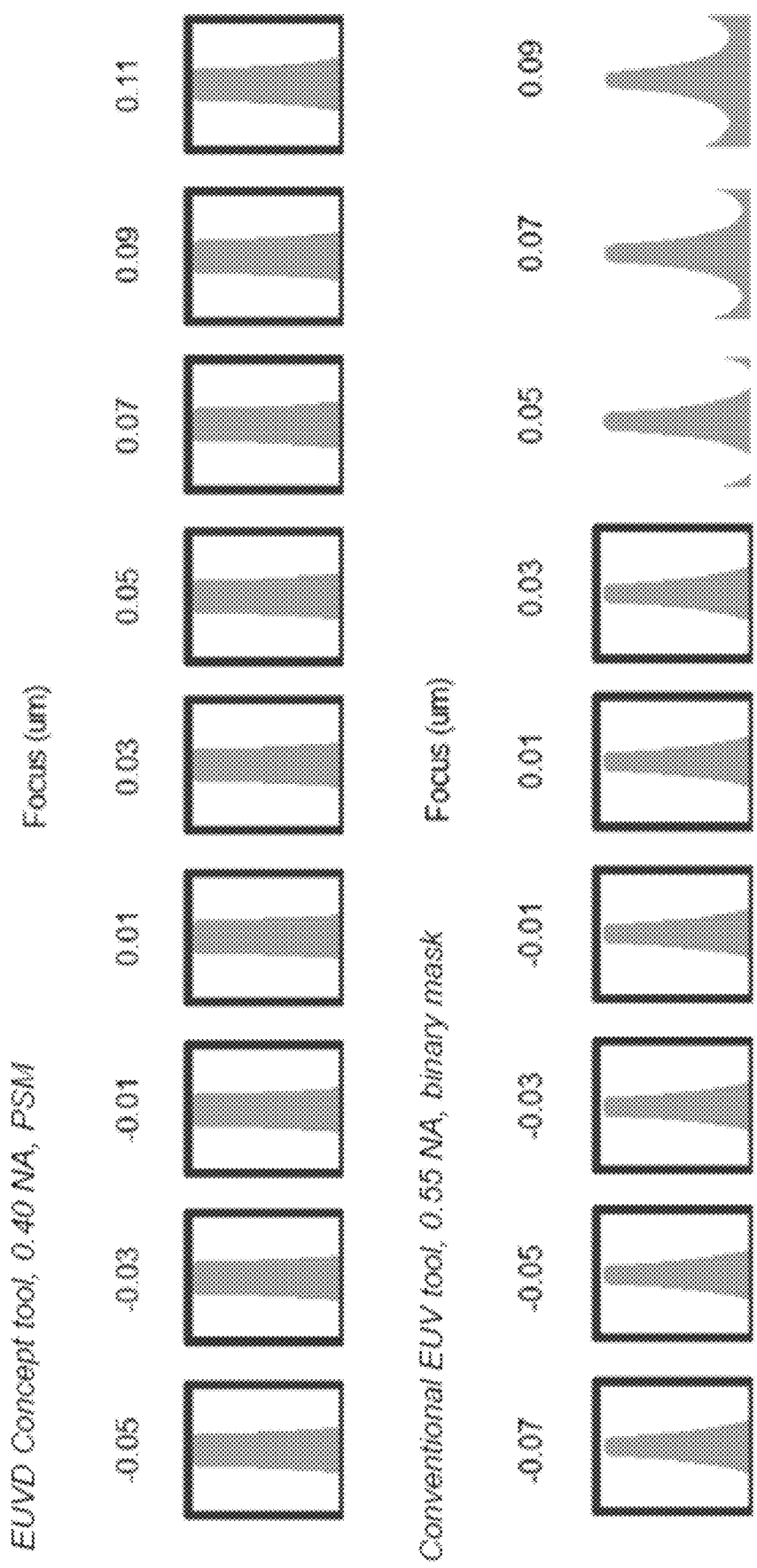
FIG. 7A provides the data output from a resist model at best dose through focus for the an embodiment of the invention and a standard high-NA 2D EUV tool of related art.

Table 3 shows aerial-image contrast for 1D gratings printed with an embodiment of the proposed 1D EUV tool, as well as standard 2D EUV tools of related art at 0.33 NA and 0.55 NA. The 0.33-NA tool cannot print a grating with a 20 nm pitch at all, and the imaging with the use of a 0.55-NA tool results in lower contrast. FIG. 7A shows the data output from a resist model at best dose through focus for an embodiment of the invention and a standard high-NA 2D EUV tool of related art, for comparison.

TABLE 3

Maximum aerial-image contrast achievable with different types of imaging.

| | EUVD-type, PSM | 0.33-NA EUV, binary | 0.55-NA EUV, binary |
|---|---|---|---|
| 20 nm pitch | 88% | — | 47% |

Figure 7B:
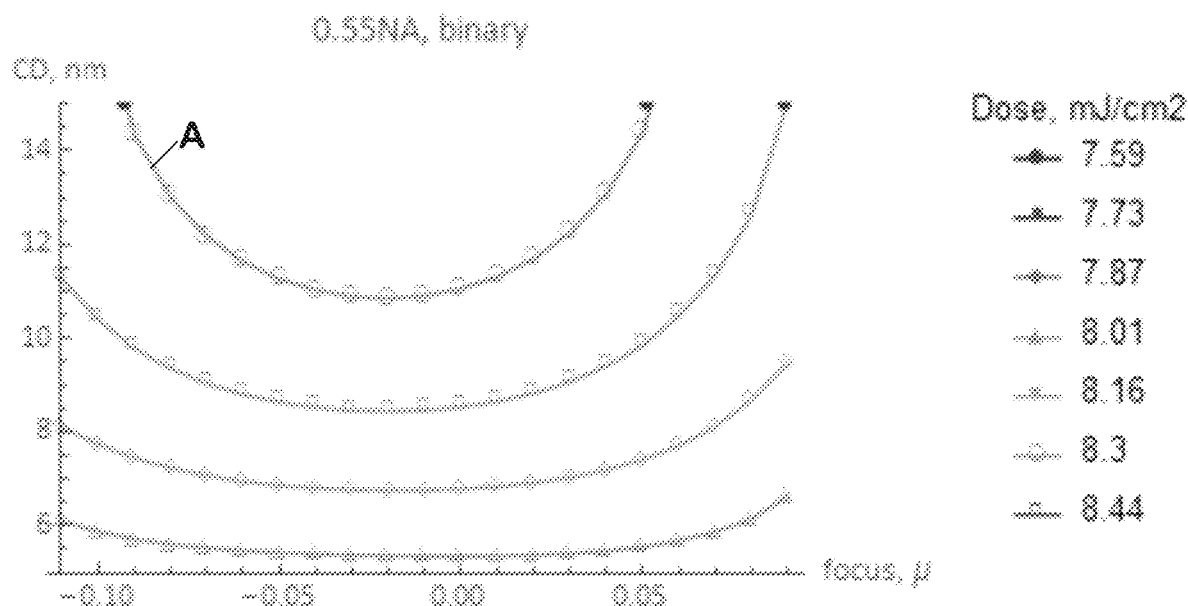
FIGS. 7B, 7C provide comparison of critical dimensions of pattern features formed lithographically with a system employed in related art and that configured according to an embodiment of the invention.
Figure 7C:
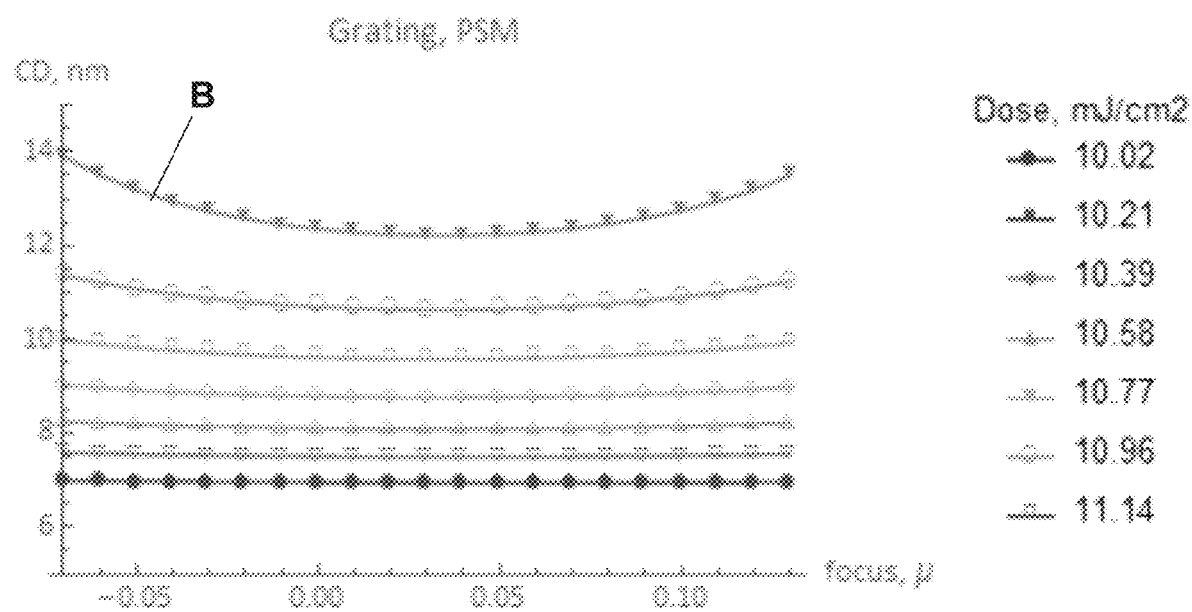

FIGS. 7B, 7C additionally illustrate, respectively, the dependences of critical dimensions (CDs) of the pattern printed on the substrate as a function of irradiation dose (in $mJ/cm^2$) and defocus (in microns) for a 2D EUV system having a NA of 0.55 and utilizing a binary mask and for an embodiment of the invention discussed above (NA=0.4, PSM). While the embodiment of the invention may require higher doses of irradiation, the embodiment demonstrates substantially smaller reduction of quality of the image: comparatively, the worsening of CDs for a given value of defocus in a 1D EUV system is substantially less than that in the 2D EUV system. For example, as is clear from the comparison of curves A and B of FIGS. 7B, 7C, the defocus of about 0.05 micron results in increase of the CD from about 11 nm to about 14.5 nm for a 2D EUV system, and only from about 12.5 nm to about 13.5 nm for a 1D EUV system. A person of skill in the art will readily appreciate the advantage of increased contrast, achieved with the use of an embodiment of the present invention.

In accordance with examples of embodiments, described in reference to FIGS. 1 through 11, a concept of a 1D EUV exposure tool has been outlined. While specific values chosen for this embodiment are recited, it is to be understood that, within the scope of the invention, the values of all of parameters may vary over wide ranges to suit different applications. For example, embodiments of the invention have been described as being not telecentric at the plane of the reticle and having the reticle position fixed during exposure. In between the exposure runs, however, or during exposure the reticle can be moved slightly along the z-axis, if required, to induce a change of magnification in the image and to effectively allow the exposure tool of the invention to expand/contract the imaged 1D pattern for geometrical match with patterns that have already been printed on the substrate.

Embodiments have been described as including a control circuitry/processor governed by instructions stored in a memory. The memory may be random access memory (RAM), read-only memory (ROM), flash memory or any other memory, or combination thereof, suitable for storing control software or other instructions and data. Those skilled in the art should also readily appreciate that instructions or programs defining the functions of the present invention may be delivered to a processor in many forms, including, but not limited to, information permanently stored on non-writable storage media (e.g. read-only memory devices within a computer, such as ROM, or devices readable by a computer I/O attachment, such as CD-ROM or DVD disks), information alterably stored on writable storage media (e.g. floppy disks, removable flash memory and hard drives) or information conveyed to a computer through communication media, including wired or wireless computer networks. In addition, while the invention may be embodied in software, the functions necessary to implement the invention may optionally or alternatively be embodied in part or in whole using firmware and/or hardware components, such as combinatorial logic, Application Specific Integrated Circuits (ASICs), Field-Programmable Gate Arrays (FPGAs) or other hardware or some combination of hardware, software and/or firmware components.

Table 4 summarizes the advantageous operational parameters of one specific embodiment of the invention in comparison with operational parameters of some 2D EUV systems.

TABLE 4

| Feature | 0.40-NA embodiment of a 1D EUV tool | 0.33-NA 2D EUV tool | 0.55-NA 2D EUV tool |
|---|---|---|---|
| Mask | Phase-shift | | Binary |
| Mask size | small | | 6-in by 6-in |
| Features | 1-D gratings only | | Multiple |
| Lens magnification | 6x | 4x | 4x/8x |

TABLE 4-continued

| Feature | 0.40-NA embodiment of a 1D EUV tool | 0.33-NA 2D EUV tool | 0.55-NA 2D EUV tool |
|---|---|---|---|
| Pitch range | 20-30 nm | ~25 nm + | ~15 nm + |
| Feature orientations | V and H in two prints, by rotating wafer | V and H simultaneously | |
| Alignment marks | Not printed | Standard | |
| Printed shot size | N/A; prints entire wafer | 26 × 33 mm | |
| Lens field width | 16.5 mm | 26 mm | |
| Overlay | ~2 nm targeted | 5 nm MMO claimed | 3 nm MMO targeted |
| Projected run rate | 50 wph or more | 50 wph (assumed) | 100 wph (assumed) |
| Dose at run rate | about 30 mJ/cm2 | 30 mJ/cm2 (assumed) | |
| Required source power at illuminator entrance | ~20 W | 80 W (assumed) | 250 W (assumed) |
| Source type | Plasma discharge, Xe or Sn | CO2 laser driven LPP | |
| Wafer size | 300 mm | 300 mm | |
| Reticle stage | Fixed | Scanning | |

Based on the combination of this disclosure and the disclosures of Our Prior Applications, a person of skill in the art will readily appreciate that various embodiment of the 1D EUV system dedicated to printing an array of straight parallel lined on a workpiece of choice have been discussed. These embodiments include but are not limited to:

An embodiment of the (EUV) exposure tool that includes an IU; a reflector (containing a pattern-source that carries a substantially-1D pattern thereon; such reflector is disposed to receive an incident beam of EUV radiation from the IU); a PO sub-system having a reference axis and configured to receive radiation from the incident beam transferred from the reflector. In one embodiment, the reflector includes a phase-shift mask. The PO sub-system is also configured to form an optical image of the 1D pattern with a reduction factor N>1 on a plane that is optically-conjugate with the reflector, and with the use of only two beams of radiation that originate at the reflector from the incident beam. The substantially 1 D-pattern has a first spatial frequency, while the optical image of it has a second spatial frequency, and the second spatial frequency is at least twice the first spatial frequency. The reflector is disposed in a substantially fixed spatial and optical relationships with respect to the IU and PO sub-system. The only two beams of radiation forming the optical image do not include a beam of radiation that represents a specular reflection of the incident beam at the reflector. The exposure tool may further include a workpiece configured such as to be moveable transversely to the reference axis. In a specific case, the IU includes first and second fly's eye (FE) reflectors. Additionally or in the alternative, the reflector may be disposed among individual constituent reflecting elements of the first FE reflector. Generally, the PO sub-system includes first and second reflectors (the first reflector having a first radius of curvature, the second reflector including a second radius of curvature, the first and second radii of curvature having opposite signs). In one implementation, the PO sub-system is a catoptric system containing primary and secondary mirror sub-systems, at least one of which primary and secondary mirror sub-systems includes two reflecting elements spatially distinct from one another.

A related embodiment of a 1D EUV exposure tool that includes an IU (with first and second fly's eye reflectors as constituent reflectors of the IU); a PO sub-system in optical communication with the IU; a reflective pattern-source disposed in a substantially fixed spatial and optical relationship with respect to the IU and PO sub-system and carrying a substantially 1D pattern thereon (the pattern-source is configured to receive a beam of radiation from the IU and transfer radiation from such beam of radiation to the PO sub-system); and a workpiece moveable transversely with respect to the reference axis of the PO sub-system. The IU may further include a relay mirror, disposed in optical communication with both the second fly's eye reflector and the reflective pattern-source. In one particular implementation, the 1D EUV exposure tool additionally includes a field stop disposed between the second fly's eye reflector and the relay mirror. The field stop generally defines an optical aperture having a polygonal perimeter. Additionally or in the alternative, the 1D EUV exposure tool is configured such that the first fly's eye reflectors, the field stop, the pattern-source, and a surface associated with the workpiece are optically-conjugate with one another. Generally, PO sub-system includes first and second mirrors, at least one of which has a central obscuration. These first and second mirrors are configured to aggregately define an anastigmatic optical system. In a specific case, the PO sub-system further includes a third mirror. In a particular implementation, the PO sub-system has only two reflectors. IN a related implementation, the PO sub-system has only three reflectors. The exposure tool may be configured such that EUV radiation from the beam of radiation is delivered through the IU and the PO sub-system towards the workpiece along the reference axis with the use of not more than ten reflectors (where these ten reflectors include the first and second fly's eye reflectors and reflectors of the PO sub-system). The pattern-source of the tool is generally equipped with a pattern-source support, which is devoid of a structure configured to scan the pattern-source in a motion synchronized with a motion of the work-piece during operation of the exposure tool. A surface of the pattern-source that carries the 1D pattern may, in a specific implementation, have a non-zero radius of curvature to define a non-zero optical power of the pattern-source. In such a case, such surface of the pattern-source has a first finite radius of curvature defined in a first plane, the first plane being transverse to such surface and containing a pattern-source axis that is perpendicular to such surface. In addition, the surface of the pattern-source may have a second finite radius of curvature defined in a second plane (the second plane being transverse to the first plane and containing the axis of the pattern-source. The first and second finite radii of curvature may be substantially equal to one another. The 1D EUV exposure tool may additionally include a source of radiation configured to emit radiation at EUV wavelengths and positioned to be optically-conjugate with both the second fly's eye reflector and an entrance pupil of the PO sub-system. In one case, the source of radiation contains a plasma-driven light emitter. The 1D EUV exposure tool may be further equipped with a control unit (configured in operable communication with the workpiece), the control unit containing a processor programmed (i) to scan the workpiece along a first axis (with respect to a position of an exposure field that is formed in a plane proximal to a surface of the workpiece with radiation delivered from the reflective pattern-source by the PO sub-system) and along such a first scan trajectory as to form a swath of parallel lines extending along the first axis, and (ii) when a pre-existing pattern has been associated with the workpiece before the scan in question, to adjust the first scan trajectory to pre-determinedly overlay the swath onto a portion of the pre-existing pattern. In a specific case, the processor is programmed to adjust the first scan trajectory during a process of scanning the workpiece to include at least one of (a) a movement along a second axis and (ii) a movement along a third axis, the second axis being perpendicular to the first axis, the third axis being perpendicular to both the first and second axes. The control unit may be further operably cooperated with at least one of the IU and the PO sub-system, and the processor may be further programmed to adjust a pitch of the swath of parallel lines to distort the swath.

An embodiment of a method for transmitting radiation through a 1D EUV exposure tool. The method includes a step of transferring first EUV radiation (received by a first reflector of the IU of such EUV exposure tool) to a reflecting pattern-source of the 1D EUV exposure tool, the pattern-source being in a substantially fixed spatial relationship with respect to the first reflector of the IU. The method includes a second step of further transferring the first EUV radiation (that has interacted with the reflective pattern-source) through a surface containing a reflective surface of a first mirror. For example, such transferring may include transmitting the first EUV radiation through a central aperture or a central obscuration of the first mirror. Transmitting the first EUV radiation through the central obscuration may include, in one case, transmitting the first EUV radiation through the central aperture a surface area of which does not exceed 40% of an area of a reflecting surface of the first mirror. The act of transferring may include impinging a first beam of the first EUV radiation onto a first location at a surface of the first mirror and impinging a second beam of said first EUV radiation onto a second location at the surface of the same first mirror, the first and second locations defined on opposite sides of the first mirror with respect to the reference axis. Alternatively or in addition, the method further comprises (a) reflecting the first radiation from a surface of the pattern-source that carries a substantially one-dimensional (1D) pattern thereon and/or (b) further comprising forming an optical image of the substantially 1D pattern with a reduction factor of N>1 on a target surface that is optically-conjugate with the reflective pattern-source. The step of forming the optical image includes forming the optical image with only two beams of radiation that originate at the reflective pattern-source as a result of the step of transferring, and the only two beams of radiation do not include a beam of light that represents a specular reflection of the first EUV radiation at the reflective pattern-source. The method can additionally include a step of forming the optical image in which a separation distance between two immediately-neighboring linear elements of the image does not exceed 10 nm; and preferably does not exceed 7 nm. In one implementation, the method further includes a step of changing a curvature of a wavefront of the first EUV radiation upon interaction of such radiation with the reflective pattern-source. The method may further include (i) transmitting the first EUV radiation through a second mirror and partially reflecting the first radiation at a surface of said second mirror on one side with respect to an optical axis of the second mirror. In this case, the steps of further transferring and transmitting the first radiation through the second mirror aggregately define transmitting the radiation through an anastigmatic mirror system having a numerical aperture of at least 0.2.

For the purposes of this disclosure and the appended claims, the use of the terms "substantially". "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art. These terms, as applied to a specified characteristic or quality descriptor means "mostly", "mainly". "considerably", "by and large", "essentially", "to great or significant extent", "largely but not necessarily wholly the same" such as to reasonably denote language of approximation and describe the specified characteristic or descriptor so that its scope would be understood by a person of ordinary skill in the art. In one specific case, the terms "approximately", "substantially", and "about", when used in reference to a numerical value, represent a range of plus or minus 20% with respect to the specified value, more preferably plus or minus 10%, even more preferably plus or minus 5%, most preferably plus or minus 2% with respect to the specified value. As a non-limiting example, two values being "substantially equal" to one another implies that the difference between the two values may be within the range of +/−20% of the value itself, preferably within the +/−10% range of the value itself, more preferably within the range of +/−5% of the value itself, and even more preferably within the range of +/−2% or less of the value itself.

The use of these term in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes.

For example, a reference to an identified vector or line or plane being substantially parallel to a referenced line or plane is to be construed as such a vector or line or plane that is the same as or very close to that of the referenced line or plane (with angular deviations from the referenced line or plane that are considered to be practically typical in related art, for example between zero and fifteen degrees, preferably between zero and ten degrees, more preferably between zero and 5 degrees, even more preferably between zero and 2 degrees, and most preferably between zero and 1 degree). For example, a reference to an identified vector or line or plane being substantially perpendicular to a referenced line or plane is to be construed as such a vector or line or plane the normal to the surface of which lies at or very close to the referenced line or plane (with angular deviations from the referenced line or plane that are considered to be practically typical in related art, for example between zero and fifteen degrees, preferably between zero and ten degrees, more preferably between zero and 5 degrees, even more preferably between zero and 2 degrees, and most preferably between zero and 1 degree). A term "substantially-rigid", when used in reference to a housing or structural element providing mechanical support for a contraption in question, generally identifies the structural element that rigidity of which is higher than that of the contraption that such structural element supports. As another example, the use of the term "substantially flat" in reference to the specified surface implies that such surface may possess a degree of non-flatness and/or roughness that is sized and expressed as commonly understood by a skilled artisan in the specific situation at hand.

Other specific examples of the meaning of the terms "substantially", "about", and/or "approximately" as applied to different practical situations may have been provided elsewhere in this disclosure.

An embodiment of the system of the invention includes electronic circuitry (for example, a computer processor) controlled by instructions stored in a memory, to perform specific data collection/processing and calculation steps as disclosed above. The memory may be random access memory (RAM), read-only memory (ROM), flash memory or any other memory, or combination thereof, suitable for storing control software or other instructions and data. Those skilled in the art should would readily appreciate that instructions or programs defining the operation of the present invention may be delivered to a processor in many forms, including, but not limited to, information permanently stored on non-writable storage media (e.g. read-only memory devices within a computer, such as ROM, or devices readable by a computer I/O attachment, such as CD-ROM or DVD disks), information alterably stored on writable storage media (e.g. floppy disks, removable flash memory and hard drives) or information conveyed to a computer through communication media, including wired or wireless computer networks. In addition, while the invention may be embodied in software, the functions necessary to implement a method of the invention may optionally or alternatively be embodied in part or in whole using firmware and/or hardware components, such as combinatorial logic, Application Specific Integrated Circuits (ASICs). Field-Programmable Gate Arrays (FPGAs) or other hardware or some combination of hardware, software and/or firmware components.

The invention as recited in claims appended to this disclosure is intended to be assessed in light of the disclosure as a whole. Various changes in the details, steps and components that have been described may be made by those skilled in the art within the principles and scope of the invention.

For example, with reference to FIG. 12, a schematic illustrating a portion of the optical system (of the 1D EUV exposure tool of the invention) that is somewhat altered in comparison with the embodiment of FIG. 5 is shown. (Note, this schematic diagram of FIG. 12 is presented without regard to scale, shape, or accuracy of mutual orientation and/or positioning of the depicted components, for simplicity of illustration.) Here, just like in the embodiment 500 of FIG. 5, a surface of the pattern-source 144' carrying the substantially 1D pattern (that is optically imaged through the PO sub-system 134, 130 onto an image surface typically associated with the workpiece 156) is spatially curved. However, in comparison with the embodiment 500, the pattern-source 144' is irradiated with the EUV radiation (shown as an arrow 1210) that arrives from the secondary source of light IF, 916 (formed, as discussed above, as a result of operation of the EUV source of the system) in an orientation that may be referred to as an off-axis orientation. In particular, the general direction of propagation 1210 of the incident-onto-the-pattern-source EUV radiation forms an oblique, non-zero angle of incidence with respect to a normal 1220, which defines an axis perpendicular to the surface of the curved pattern-source 144'. In a specific case, the angle of incidence of the EUV radiation 1210 onto the pattern-source 144' is chosen to ensure that, for example, a projection of an averaged wave-vector of radiation 1210 onto the surface of the pattern-source 144' is substantially parallel to the axis along which the lines of the substantially 1D pattern are extended. For example, in the case when the substantially 1D pattern of the pattern source is formed by a 1D diffraction grating, the plane of incidence of radiation 1210 onto the pattern-source 144' is substantially parallel to the grating lines and the reference axis (such as the normal 1220). As shown in the view of FIG. 12, the lines of the substantially 1D pattern of the pattern-source 144' are extending along the y-axis.

Referring again to FIG. 1B, for example, it would be appreciated that a similarly-arranged off-axis irradiation of the pattern-source can be employed in the optical system (of the 1D EUV exposure tool) that employs a substantially planar or flat pattern-source 144, and/or in the optical system that employs the relay reflector 126.

Accordingly, the scope of the invention includes such mutual orientation of the IU and the pattern source, within the optical system of the 1D EUV exposure tool, with which the last optical element of the IU (be it an FE reflector or a relay reflector) reflects the EUV radiation towards the pattern-source along an axis a projection of which onto the pattern-carrying surface of the pattern-source is parallel to the longitudinal extent of the elements of the substantially 1D pattern.

The choice of the off-axis irradiation arrangement may be beneficial to reduce the loss of imaging contrast across the FOV and, in some cases, to reduce or avoid phase effects (on propagation of the radiation from the pattern source through the PO sub-system and further towards the image surface) that may otherwise require compensation by either changing the structure of the light source or the structure of the pattern-source itself. Considering the fact that, generally, acceptable variations on at least the structure of the pattern-source for use with the embodiment of the invention are limited, the implementation of the off-axis irradiation of the pattern-source may prove advantageous in practice. Due to the substantially 1D nature of the pattern of the pattern-source 144, 144' and the fact that the zeroth order of diffraction formed at the pattern-source from the incident radiation 1210 is generally blocked while the system is configured to ensure that optical components do not interfere with the propagation of +1 and −1 orders of diffraction through the PO sub-system (as discussed in Our Prior Applications), the requirements on specific angle of incidence in an embodiment of the invention are somewhat lax.

In reference to FIG. 12, for example, in one embodiment the angle of incidence of radiation arriving from the IU onto the pattern-source is within a range from about zero degrees to about 40 degrees; in a related embodiment—within a range from about 10 degrees to about 30 degrees. It should be understood that these ranges provide only examples of angle ranges. In actual embodiments, an angle or range of angles of incidence may be used, anywhere from 0 to substantially 90 degrees.

Disclosed aspects, or portions of these aspects, may be combined in ways not listed above. Accordingly, the invention should not be viewed as being limited to the disclosed embodiment(s).

The invention claimed is:

1. An exposure apparatus comprising:
a pattern-source that includes a first surface carrying a substantially-one-dimensional (1D) pattern thereon, the pattern being a periodic pattern of lines having a first period in a first direction, the lines extending in a second direction that is transverse to the first direction;
an illumination system configured to deliver extreme-UV (EUV) radiation from a first side, with respect to the first surface, to irradiate the pattern with said EUV radiation, the illumination system containing at least one illumination mirror on the first side with respect to the first surface;
a projection system having at least one projection mirror located on the first side with respect to the first surface, wherein the projection system
includes a projection mirror having first and second reflection regions that are disposed along the first direction and
is configured to form an image of the pattern on a second surface in light formed by first and second diffracted beams of said EUV radiation that are formed as a result of diffraction of said EUV radiation at the pattern, the second surface being optically-conjugate with the first surface,
a moveable workpiece stage configured to hold a workpiece and, in operation of the exposure apparatus, to move the workpiece along the second direction,
wherein the apparatus is configured to direct the EUV radiation, reflected by the at least one illumination mirror, to pass between the first and second reflection regions to expose the workpiece with said EUV radiation while the workpiece is moved along the second direction with respect to the image and the pattern-source is fixed, and
wherein a first extent of the at least one illumination mirror along the first direction is smaller than a second extent of the at least one illumination mirror along the second direction.

2. The exposure apparatus according to claim 1, wherein the at least one illumination mirror includes a fly's eye reflector having a plurality of mirror elements arranged on a third plane.

3. The exposure apparatus according to claim 1, wherein the illumination system includes a fly's eye reflector having a plurality of mirror elements arranged on a third plane, and wherein the at least one illumination mirror is disposed to receive the EUV radiation reflected from the fly's eye mirror.

4. The exposure apparatus according to claim 3, wherein the fly's eye reflector has a first dimension in the first direction and a second dimension in the second direction, and wherein the second dimension is larger than the first direction.

5. The exposure apparatus according to claim 1, wherein the projection system is configured to form the image of the pattern on the second plane with the use of only two beams of said EUV radiation diffracted from the pattern in reflection.

6. The exposure apparatus according to claim 5, wherein said only two beams represent positive and negative first order diffracted beams.

7. The exposure apparatus according to claim 1, wherein the image of pattern has a second period that is twice as large as the first period.

8. The exposure apparatus according to claim 1, wherein the at least one projection mirror includes a first projection mirror disposed to reflect said EUV radiation that has diffracted at the pattern, and a second projection mirror disposed to receive said EUV radiation that has been reflected by the first projection mirror.

9. The exposure apparatus according to claim 8, wherein the illumination system includes at least one illumination mirror disposed in a space between the first and second projection mirrors.

10. The exposure apparatus according to claim 9,
wherein the first projection mirror includes first and second reflection regions arranged along the first direction with respect to one another to reflect, respectively, the first and second diffracted beams,
wherein the second projection mirror includes third and fourth reflection regions arranged along the first direction with respect to one another to reflect, respectively, the first and second diffracted beams, and
wherein the apparatus is configured to transmit the EUV radiation from the at least one illumination mirror between the third and fourth reflection regions.

11. The exposure apparatus according to claim 10, wherein the projection system is configured
to receive the first diffracted beam from the pattern-source at the first reflection region and then to receive said first diffracted beam, that has been reflected by the first reflection region, by the third reflection region, and
to receive the second diffracted beam from the pattern source at the second reflection region and then to receive said second diffracted beam, that has been reflected by the second reflection region, by the fourth reflection region.

12. The exposure apparatus according to claim 11, configured to transmit the first and second diffracted beams from the pattern-source between the third and fourth reflection regions towards the first mirror, then to reflect said first and second diffracted beams at the third and fourth reflection regions, respectively.

13. The exposure apparatus according to claim 12, configured to transmit the first and second diffracted beams from the pattern-source between the third and fourth reflection regions towards the first mirror, then to reflect said first and second diffracted beams at the third and fourth reflection regions, respectively, and then to transmit said first and second diffracted beams between the first and second reflection regions.

14. The exposure apparatus according to claim 12,
wherein the first projection mirror has a first aperture between the first and second reflection regions, and
wherein the second projection mirror has a second aperture between the third and fourth reflection regions.

15. The exposure apparatus according to claim 10,
wherein the first projection mirror includes
a first mirror element having the first reflection region, and a second mirror element having the second reflection region, the first and second mirror elements being spatially separated from one another; and wherein the second projection mirror includes a third mirror element having the third reflection region and a fourth mirror elements having the fourth reflection region, the third and fourth mirror elements being spatially separated from one another.

16. The exposure apparatus according to claim 8, wherein the first projection mirror has a convex reflecting surface, and wherein the second projection mirror has a concave reflecting surface.

17. The exposure apparatus according to claim 1, wherein the pattern includes a phase pattern.

18. The exposure apparatus according to claim 1, wherein the first surface is a planar surface.

19. The exposure apparatus according to claim 1, wherein the first plane is a curved surface.

20. The exposure apparatus according to claim 1, wherein the first surface is a curved surface.

21. The exposure apparatus according to claim 20, wherein the region on the second surface has a polygonal perimeter, a side of said polygonal perimeter extending in a third direction, the third direction being different from the first direction and the second direction.

22. The exposure apparatus according to claim 21, wherein the workpiece contains the second surface, and wherein the exposure apparatus is configured, in operation, to form a first exposed region of the workpiece by projecting the image of the pattern thereon while moving the workpiece in the first direction, the first region being extended in the first direction, and to form a second exposed region of the workpiece by projecting the image of the pattern thereon while moving the workpiece in the second direction, the second exposed region being extended in the second direction wherein the first and second exposed regions are partially overlapped in the first direction.

23. The exposure apparatus according to claim 21, wherein, in operation of the exposure apparatus, said side of the polygonal perimeter is moved in the second direction on a region of overlap of the first and second exposed regions.

24. The exposure apparatus of claim 1, wherein the at least one projection mirror includes a first projection mirror disposed to reflect said EUV radiation that has diffracted at the pattern, and a second projection mirror disposed to receive said EUV radiation that has been reflected by the first projection mirror, the first projection mirror being a most proximal mirror to the workpiece and the second projection mirror is a most distal mirror from the workpiece.

25. The exposure apparatus of claim 24, wherein the first projection mirror defines the first and second reflection regions about a first projection mirror aperture and the second projection mirror defines third and fourth reflection regions situated about a second projection mirror aperture.

26. The exposure apparatus of claim 24, wherein the at least one projection mirror includes only the first projection mirror and the second projection mirror.

27. An exposure apparatus comprising:

a pattern-source including a first surface carrying a substantially-one-dimensional (1D) pattern thereon, the pattern being a periodic pattern of lines having a first period in a first direction, the lines extending in a second direction that is transverse to the first direction;

an illumination system configured to deliver extreme-UV (EUV) radiation from a first side, with respect to the first surface, to irradiate the pattern with said EUV radiation, wherein the illumination system contains at least one illumination mirror disposed on the first side with respect to the first surface, wherein the illumination system includes at least one illumination mirror disposed in a space between the first and second projection mirrors;

a projection system having at least one projection mirror located on the first side with respect to the first surface, wherein the at least one projection mirror includes a first projection mirror disposed to reflect said EUV radiation that has diffracted at the pattern, and a second projection mirror disposed to receive said EUV radiation that has been reflected by the first projection mirror, wherein the projection system is configured to form an image of the pattern on a workpiece in light formed by first and second diffracted beams of said EUV radiation that are formed as a result of diffraction of said EUV radiation at the pattern, the second surface being optically-conjugate with the first surface, wherein the first projection mirror is a most proximal mirror of the projection system to the workpiece and the second projection mirror is a most distal mirror of the projection system from the workpiece, and a moveable workpiece stage configured to hold a workpiece and, in operation of the exposure apparatus, to move the workpiece along the second direction, wherein the apparatus is configured to expose the workpiece with said EUV radiation while the workpiece is moved along the second direction with respect to the image, and wherein a first extent of the at least one illumination mirror along the first direction is smaller than a second extent of the at least one illumination mirror along the second direction.

28. The exposure apparatus according to claim 27, wherein at least one of the following conditions is satisfied:

a) the at least one illumination mirror includes a fly's eye reflector having a plurality of mirror elements arranged on a third plane;

b) wherein the illumination system includes a fly's eye reflector having a plurality of mirror elements arranged on a third plane, and wherein the at least one illumination mirror is disposed to receive the EUV radiation from the fly's eye mirror;

c) wherein the projection system is configured to form the image of the pattern on the second plane with the use of only two beams of said EUV radiation diffracted from the pattern in reflection;

d) wherein the first surface is the planar surface;

e) where in the first surface is the curved surface.

29. An exposure apparatus comprising:

a pattern-source including a first surface carrying a substantially-one-dimensional (1D) pattern thereon, the pattern being a periodic pattern of lines having a first period in a first direction, the lines extending in a second direction that is transverse to the first direction;

an illumination system configured to deliver extreme-UV (EUV) radiation from a first side, with respect to the first surface, to irradiate the pattern with said radiation;

a projection system having only two projection mirrors located on the first side with respect to the first surface,
wherein the projection system includes a first projection mirror having first and second reflection regions disposed along the first direction and configured to form an image of the pattern on a second surface with light formed by first and second diffracted beams of said EUV radiation that are formed as a result of diffraction of said EUV radiation at the pattern, the second surface being optically-conjugate with the first surface,
wherein the illumination system contains at least one illumination mirror that is disposed on the first side with respect to the first surface to reflect the EUV radiation to form a beam passing between the first and second reflection regions; and
a moveable workpiece stage configured to hold a workpiece and, in operation of the exposure apparatus, to move the workpiece along the second direction to expose the workpiece to the image while the workpiece is moved along the second direction with respect to the image, and
wherein a first extent of the at least one illumination mirror along the first direction is smaller than a second extend extent of the at least one illumination mirror along the second direction.

\* \* \* \* \*